(12) United States Patent
Sendai et al.

(10) Patent No.: US 7,241,372 B2
(45) Date of Patent: Jul. 10, 2007

(54) PLATING APPARATUS AND PLATING LIQUID REMOVING METHOD

(75) Inventors: Satoshi Sendai, Tokyo (JP); Kenya Tomioka, Tokyo (JP); Katsumi Tsuda, Tokyo (JP)

(73) Assignee: Ebara Corporation, Tokyo (JP)

( * ) Notice: Subject to any disclaimer, the term of this patent is extended or adjusted under 35 U.S.C. 154(b) by 560 days.

(21) Appl. No.: 10/740,630

(22) Filed: Dec. 22, 2003

(65) Prior Publication Data

US 2004/0129575 A1 Jul. 8, 2004

Related U.S. Application Data

(62) Division of application No. 09/922,680, filed on Aug. 7, 2001, now Pat. No. 6,689,216.

(30) Foreign Application Priority Data

Aug. 9, 2000 (JP) ............................... 2000-241503

(51) Int. Cl.
*C25D 21/08* (2006.01)
*C25D 7/12* (2006.01)

(52) U.S. Cl. .......................... 205/80; 205/157; 134/21; 134/23; 134/24; 134/33; 134/34; 134/902; 427/99.5; 427/443.1

(58) Field of Classification Search ..................... None
See application file for complete search history.

(56) References Cited

U.S. PATENT DOCUMENTS 4,788,994 A 12/1988 Shinbara et al.
5,552,026 A 9/1996 Ikegaya et al.
5,738,776 A 4/1998 Florio et al.
5,853,559 A * 12/1998 Tamaki et al. .............. 205/157
6,017,437 A * 1/2000 Ting et al. .................... 205/80
6,056,869 A 5/2000 Uzoh
6,352,623 B1 3/2002 Volodarsky et al.
6,638,411 B1 10/2003 Mishima et al.
6,660,139 B1 12/2003 Sendai et al.
2001/0024691 A1* 9/2001 Kimura et al. .............. 427/346
2002/0006876 A1* 1/2002 Hongo et al. ............... 505/191
2002/0029961 A1 3/2002 Dordi et al.

FOREIGN PATENT DOCUMENTS

| EP | 0 385 590 | 9/1990 |
|---|---|---|
| EP | 0 641 874 | 3/1995 |
| EP | 1 026 286 | 8/2000 |
| EP | 1 103 639 | 5/2001 |
| JP | 2000-008192 | * 1/2000 |

* cited by examiner

*Primary Examiner*—Harry D. Wilkins, III
(74) *Attorney, Agent, or Firm*—Wenderoth, Lind & Ponack, L.L.P.

(57) ABSTRACT

A plating apparatus and a plating liquid removing method removes a plating liquid remaining on a substrate-contacting portion, or portions in its vicinity, of a substrate holding member. The plating apparatus comprises a head having a rotatable housing provided with a substrate holding member for holding a substrate, a plating process container, disposed below the head, for holding a plating liquid therein, and a plating liquid removing mechanism for removing plating liquid remaining on the substrate-contacting portion, or the portions in its vicinity, at an inner circumferential edge of the substrate holding member.

21 Claims, 15 Drawing Sheets

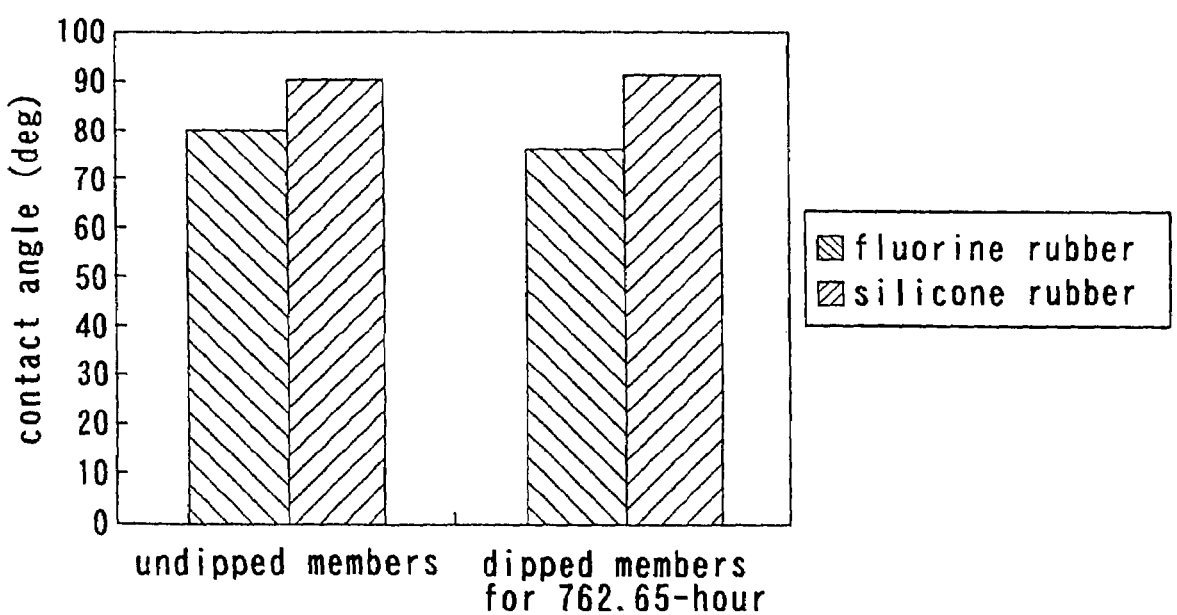
F I G. 18

PLATING APPARATUS AND PLATING LIQUID REMOVING METHOD

This application is a divisional of U.S. application Ser. No. 09/922,680, filed Aug. 7, 2001 now U.S. Pat. No. 6,689,216.

BACKGROUND OF THE INVENTION

1. Field of the Invention

The present invention relates to a plating apparatus and a plating liquid removing method, and more particularly to a plating apparatus useful for filling a metal such as copper into recesses for interconnects formed in a semiconductor substrate, and a method for removing plating liquid remaining on a substrate-contacting portion, or portions in its vicinity, of a substrate holding member for use in the plating apparatus.

2. Description of the Related Art

Generally, aluminum or aluminum alloy has been used as a material for forming interconnect circuits on a surface of a semiconductor substrate. Higher integrated density on the semiconductor substrate requires that a material having a higher electric conductivity should be used for interconnect circuits. Therefore, there has been proposed a method comprising plating a surface of a substrate to fill interconnect patterns, formed in the substrate, with copper or a copper alloy.

Various methods such as chemical vapor deposition (CVD) process, sputtering process, and the like have been used to fill interconnect patterns, formed in a substrate, with copper or a copper alloy. However, when a metallic layer on a substrate is formed of copper or a copper alloy, i.e., when copper interconnects are formed on the substrate, the CVD process requires high cost, and, if an aspect ratio is high (i.e., a depth of the pattern is larger than a width thereof), then it is difficult to fill the interconnect patterns with copper or a copper alloy during a sputtering process. Therefore, the aforementioned plating method is most effective to fill interconnect patterns, formed in a substrate, with copper or a copper alloy.

There are various methods for plating a surface of a semiconductor substrate with copper. For example, in a cup-type plating method, a dip-type plating method, or the like, a plating tank always holds a plating liquid, and a substrate is dipped into the plating liquid. In another plating method, a plating tank holds a plating liquid only when a substrate is fed into a plating container. Further, in an electrolytic plating method, an electric potential difference is applied to plate a substrate. On the other hand, in an electroless plating method, an electric potential difference is not applied.

In cup-type plating apparatuses, a substrate is held by a substrate holding member with a peripheral edge and a back surface of the substrate being sealed, and plating is performed by contacting an exposed front surface of the substrate with a plating liquid. After this plating treatment, plating liquid is likely to remain on a substrate-contacting portion, or portions in its vicinity, of a substrate holding member. This remaining plating liquid, when dried, can produce undesired particles. Moreover, the remaining plating liquid can adhere to a subsequent substrate to be plated, leading to an insufficient plating of this substrate.

A method has been developed for removing such a plating liquid remaining on the substrate-contacting portion, or portions in its vicinity, of a substrate holding member. According to this method, a plating liquid removing device, having an absorbent for absorbing a plating liquid, or a sucking tool for sucking a plating liquid, is allowed to move in a circumferential direction along the substrate-contacting portion, or portions in its vicinity, of a substrate holding member so as to remove by absorption or suction plating liquid remaining on the substrate-contacting portion or portions in its vicinity.

The above conventional plating apparatuses that carry out this method, however, have the following drawbacks. The conventional apparatuses are so designed that the substrate holding member is fixed stationarily while the plating liquid removing device is allowed to rotate. This makes it impossible to conduct dewatering (spin-drying) of the substrate-contacting portion, or portions in its vicinity, of the substrate holding member. Since a large quantity of plating liquid thus remains, it is necessary to conduct a plating liquid removing operation for every plating treatment. Moreover, each plating liquid removing operation requires a considerably long time. Furthermore, removal of the large a quantity of plating liquid leads to consumption of an increased amount of plating liquid, resulting in an increased production cost.

SUMMARY OF THE INVENTION

The present invention has been made in view of the above drawbacks in the related art. It is therefore an object of the present invention to provide a plating apparatus and a plating liquid removing method which can easily and quickly remove plating liquid remaining on a substrate-contacting portion, or portions in its vicinity, of a substrate holding member, and which allows for a simplified apparatus structure that requires a smaller space for installation.

According to a first aspect of the present invention, there is provided a plating apparatus, comprising: a head having a rotatable housing provided with a substrate holding member for holding a substrate; a plating process container, disposed below the head, for holding a plating liquid therein; and a plating liquid removing mechanism for removing plating liquid remaining on a substrate-contacting portion, or portions in its vicinity, at an inner circumferential edge of the substrate holding member.

The above apparatus can effectively remove the liquid remaining on the substrate-contacting portion, or portions in its vicinity, at the inner circumferential edge of the substrate holding member, forcibly. This can avoid a problem of particle generation that would be caused by unremoved plating liquid after it has dried. A possible dissolution of a seed layer of a subsequent substrate by unremoved plating liquid can also be avoided. Further, the above apparatus, which allows the substrate holding member to rotate, makes it possible to remove plating liquid and, in addition, eliminates a need to rotate the plating liquid removing mechanism.

In a preferred aspect of this invention, the plating liquid removing mechanism has a plating liquid suction nozzle which can move close to the substrate-contacting portion at the inner circumferential edge of the substrate holding member and suck plating liquid remaining on the substrate-contacting portion, or the portions in its vicinity.

The plating liquid suction nozzle may have an arc shape extending along the substrate-contacting portion of the substrate holding member, and may be designed to be movable in vertical and horizontal directions. Use of such a suction nozzle can carry out the of plating liquid remaining on the substrate-contacting portion, or the portions in its vicinity, efficiently in a short time.

In a preferred aspect of this invention, the plating liquid removing mechanism also has a cleaning liquid injection nozzle which can move close to the substrate-contacting portion at the inner circumferential edge of the substrate holding member and eject a cleaning liquid toward the substrate-contacting portion, or portions in its vicinity.

With this construction, the cleaning liquid injection nozzle ejects a cleaning liquid, e.g. pure water, toward the substrate-contacting portion, or the portions in its vicinity, at the inner circumferential edge of the substrate holding member, thereby cleaning the substrate-contacting portion, or the portions in its vicinity. Further, plating liquid remaining on the substrate-contacting portion, or the portions in its vicinity, is suction-removed, together with cleaning liquid, by the plating liquid suction nozzle. This can prevent plating liquid from remaining inside the plating liquid suction nozzle and clogging the nozzle after the liquid has dried.

According to a second aspect of this invention, there is provided a plating apparatus, comprising: a head having a rotatable housing provided with a substrate holding member for holding a substrate; and a plating process container, disposed below the head, for holding a plating liquid therein; wherein the substrate holding member is provided with a sealing member for sealing an outer peripheral edge of the substrate, with the sealing member being made of a highly water-repellent material.

With this construction, the sealing member, which is to be contacted with the substrate, is made of a highly water-repellent material. This can reduce an amount of plating liquid that remains on a surface of the sealing member. Silicone rubbers may be used as the highly water-repellent material. Ordinary silicone rubbers, however, have a poor durability. In order to ensure a sufficiently high tensile strength, it is preferred to use a high-tearing strength silicone rubber having enhanced tensile strength. Use of such a specific rubber provides a sealing member having both a good sealing property and high durability.

According to a third aspect of this invention, there is provided a plating apparatus, comprising: a head having a rotatable housing provided with a substrate holding member for holding a substrate; a plating process container, disposed below the head, for holding a plating liquid therein; and a plating liquid removing mechanism for removing a plating liquid remaining on a substrate-contacting portion, or portions in its vicinity, at an inner circumferential edge of the substrate holding member; wherein the substrate holding member is provided with a sealing member for sealing an outer peripheral edge of the substrate, with the sealing member being made of a highly water-repellent material.

According to a fourth aspect of this invention, there is provided a plating apparatus, comprising: a head having a rotatable housing provided with a substrate holding member for holding a substrate; and a plating process container, disposed below the head, for holding a plating liquid therein; wherein the substrate holding member is provided with a sealing member for sealing an outer peripheral edge of the substrate, with the sealing member having a substrate-contacting portion which is in a shape of a spire, in cross section, with a flat top surface.

With this construction, the specific configuration of the sealing member at the substrate-contacting portion can enhance rigidity of the substrate-contacting portion, and furthermore, and can cause plating liquid to remain on an inner side of the top flat surface, thereby not allowing the plating liquid to flow to an outer side (electrical contact side). This is advantageous because plating liquid, if flowed to the outer side, would not sufficiently be suction-removed and would still remain.

According to a fifth aspect of this invention, there is provided a plating apparatus, comprising: a head having a rotatable housing provided with a substrate holding member for holding a substrate; a plating process container, disposed below the head, for holding a plating liquid therein; and a plating liquid removing mechanism for removing a plating liquid remaining on a substrate-contacting portion, or portions in its vicinity, at an inner circumferential edge of the substrate holding member; wherein the substrate holding member is provided with a sealing member for sealing an outer peripheral edge of the substrate, with the sealing member having a substrate-contacting portion which is in a shape of a spire, in cross section, with a flat top surface.

According to a sixth aspect of this invention, there is provided a method for removing a plating liquid remaining on a substrate-contacting portion, or portions in its vicinity, at an inner circumferential edge of a substrate holding member for holding a substrate, comprising: rotating the substrate holding member to remove plating liquid from the substrate holding member; and sucking plating liquid remaining on the substrate-contacting portion, or portions in its vicinity, of the substrate holding member, while the substrate holding member is rotated.

According to a seventh aspect of this invention, there is provided a plating method, comprising: plating a substrate held by a substrate holding member of a rotatable housing; rotating the housing to remove a plating liquid remaining on the substrate and the substrate holding member; removing the substrate from the housing; and sucking plating liquid remaining on a substrate-contacting portion, or portions in its vicinity, at an inner circumferential edge of the substrate holding member, while the substrate holding member is rotated.

According to an eighth aspect of this invention, there is provided a plating apparatus comprising: a head having a rotatable housing provided with a substrate holding member for holding a substrate; a plating process container, disposed below the head, for holding a plating liquid therein; and a plating liquid removing mechanism for removing a plating liquid remaining on a substrate-contacting portion, or portions in its vicinity, at an inner circumferential edge of the substrate holding member; wherein the plating liquid removing mechanism has a plating liquid sucking member which is allowed to be introduced into the housing through an opening of the housing and to move near to the substrate holding member, with the plating liquid sucking member, when located so as to face the substrate holding member, sucking and removing plating liquid remaining on the substrate-contacting portion, or the portions in its vicinity, at the inner circumferential edge of the substrate holding member, while the substrate holding member is rotated.

According to a ninth aspect of this invention, there is provided a plating method, comprising: plating a substrate held by a substrate holding member of a rotatable housing; rotating the housing to remove a plating liquid remaining on the substrate and the substrate holding member; removing the substrate from the housing through an opening of the; causing a plating liquid-sucking member of a plating liquid removing mechanism to face the substrate holding member by introducing the plating liquid removing mechanism into the housing through the opening; and removing plating liquid remaining on the substrate-contacting portion, or portions in its vicinity, at an inner circumferential edge of the substrate holding member in such a state that the plating liquid-sucking member closely faces the substrate holding member, while the substrate holding member is rotated.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 18 is a graph showing change in contact angle for fluorine rubber- and silicone rubber-sealing members before and after 762.65-hour dipping in plating liquid.

DETAILED DESCRIPTION OF THE PREFERRED EMBODIMENTS

A plating apparatus according to embodiments of the present invention will be described below with reference to the accompanying drawings.

A plating apparatus according to embodiments of the present invention is used for plating a surface of a semiconductor substrate with copper, for thereby manufacturing semiconductor devices on which interconnects having a copper layer are formed. This plating process will be described below with reference to FIGS. 1A through 1C.

Figure 1A:
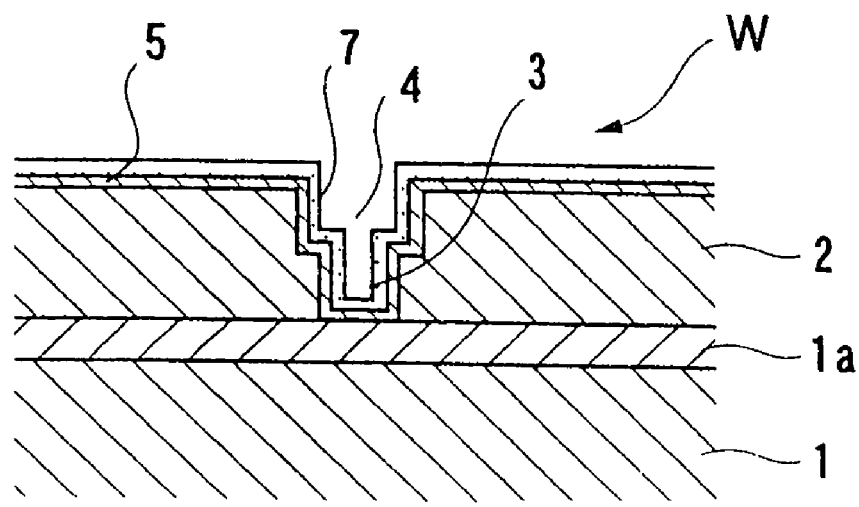
FIGS. 1A through 1C are cross-sectional views showing an example of a plating process utilizing a plating apparatus according to the present invention.

As shown in FIG. 1A, an insulating film 2 of $SiO_2$ is deposited over a conductive layer 1a on a semiconductor base 1 having semiconductor devices, and then a contact hole 3 and a trench 4 for an interconnect are formed by lithography and etching technology. A barrier layer 5 made of TiN or the like is formed on the insulating film 2, and a copper seed layer 7 as an electric supply layer for an electrolytic plating is formed on the barrier layer 5 by sputtering or the like.

Figure 1B:
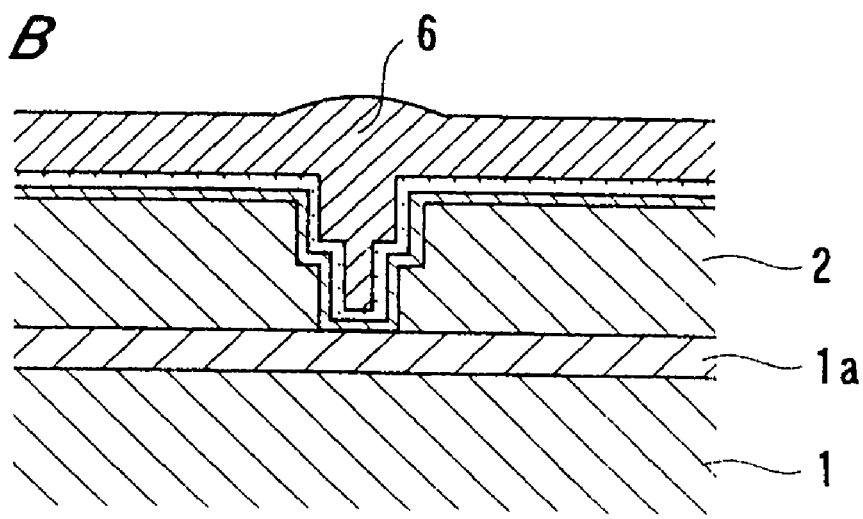
Figure 1C:
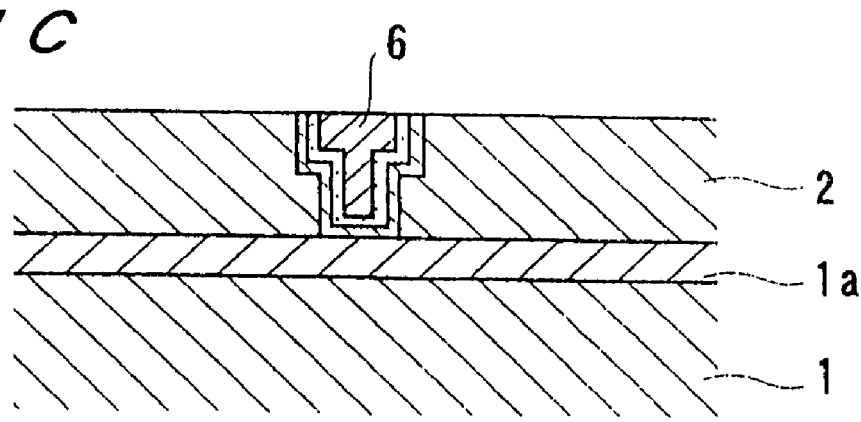

Subsequently, as shown in FIG. 1B, a surface of a substrate W is plated with copper. Hence, the contact hole 3 and the trench 4 on the semiconductor base 1 are filled with copper, and a copper layer 6 is formed on the insulating film 2. Thereafter, the copper layer 6 on the insulating film 2 is removed by chemical mechanical polishing (CMP) so that a surface of the copper layer 6 filled in the contact hole 3 and the trench 4 is made substantially even with a surface of the insulating film 2. Thus, as shown in FIG. 1C, an interconnect comprising copper 6 is formed.

Figure 2:
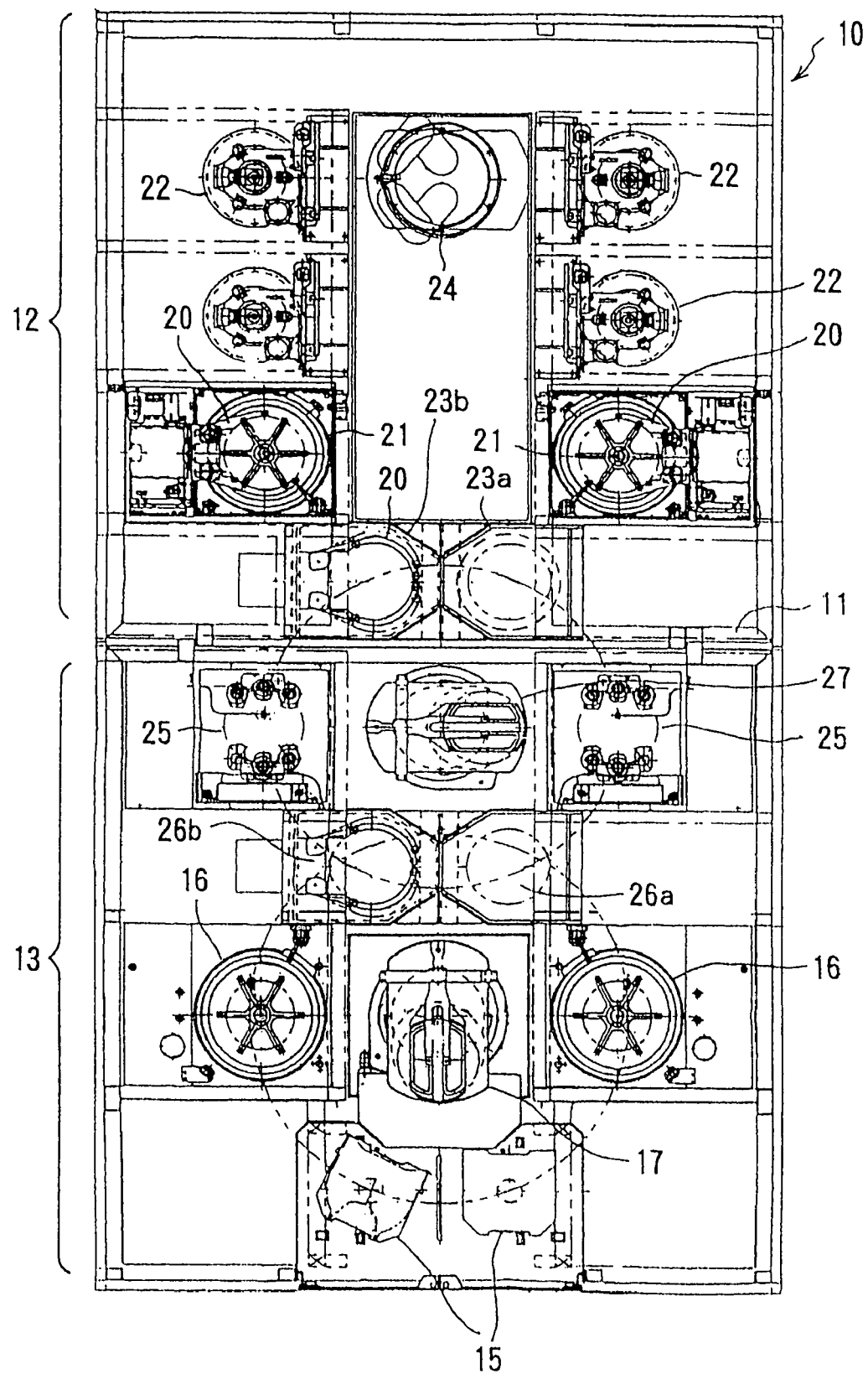
FIG. 2 is a plan view showing a layout of a plating apparatus according to a first embodiment of the present invention.

A plating apparatus for electrolytically plating a semiconductor substrate W according to a fist embodiment of the present invention will be described below with reference to FIG. 2. As shown in FIG. 2, the plating apparatus is disposed in a rectangular facility 10, and is constituted so as to plate a semiconductor substrate with copper continuously. The facility 10 has a partition wall 11 for dividing the facility 10 into a plating section 12 and a clean section 13. Air can individually be supplied into and exhausted from each of the plating section 12 and the clean section 13. The partition wall 11 has a shutter (not shown) capable of opening and closing. Pressure of the clean section 13 is lower than atmospheric pressure and higher than pressure of the plating section 12. This can prevent air in the clean section 13 from flowing out of the facility 10 and can prevent air in the plating section 12 from flowing into the clean section 13.

In the clean section 13, there are provided two cassette stages 15 for placing a substrate cassette thereon, and two cleaning and drying units 16 for cleaning (rinsing) a plated substrate with pure water and drying the substrate. Further, a rotatable fixed-type first transfer device (tetraxial robot) 17 for transferring a substrate is provided in the clean section 13. For example, each cleaning and drying unit 16 has cleaning liquid supply nozzles for supplying ultrapure water to both surfaces of a substrate, and spins the substrate at a high speed to dewater and dry the substrate.

On the other hand, in the plating section 12, there are provided two pre-treatment units 21 for pre-treating a surface of a substrate for plating, and inverting the pre-treated substrate by a inverter 20, four plating units 22 for plating a surface of a substrate with copper in such a state that a front surface of the substrate faces downwardly, and two first substrate stages 23a, 23b for holding a substrate placed thereon. Further, a rotatable mobile-type second transfer device (tetraxial robot) 24 for transferring a substrate is provided in the plating section 12.

In the clean section 13, there are provided two chemical liquid cleaning units 25 for cleaning a plated substrate with chemical liquid, and second substrate stages 26a, 26b disposed between the chemical liquid cleaning units 25 and the cleaning and drying units 16. A rotatable fixed-type third transfer device (tetraxial robot) 27 for transferring a substrate is provided between the two chemical liquid cleaning units 25.

One of the first substrate stage 23b and the second substrate stage 26b are constituted so as to clean a substrate with water. Each of the first substrate stage 23b and the second substrate stage 26b has an inverter 20 for inverting a substrate.

Thus, the first transfer device 17 transfers a substrate between the substrate cassettes placed on the cassette stages 15, the cleaning and drying units 16, and the second substrate stages 26a, 26b. The second transfer device 24 transfers a substrate between the first substrate stages 23a, 23b, the pre-treatment units 21, and the plating units 22. The third transfer device 27 transfers a substrate between the first substrate stages 23a, 23b, the chemical liquid cleaning units 25, and the second substrate stages 26a, 26b.

The transfer device 17 has two recess-type hands, respectively for supporting a peripheral edge of a substrate by a recess. An upper hand is used for handling a dry substrate and a lower hand is used for handling a wet substrate. Each of the transfer devices 24 and 27 has two recess-type hands, which are used for handling a wet substrate. The hands of the transfer devices are not limited to those types described above.

In the present embodiment, the plating apparatus comprises the chemical liquid cleaning units 25 for cleaning a surface of a substrate with chemical liquid such as dilute hydrofluoric acid or hydrogen peroxide. If it is not necessary to clean a plated substrate with chemical liquid, the chemical liquid cleaning units 25 are not required. In this case, the first transfer device 17 transfers a substrate between the substrate cassettes placed on the cassette stages 15, the cleaning and drying units 16, and the first substrate stages 23a, 23b to thus dispense with the third transfer device 27 and the second substrate stages 26a, 26b.

Next, a processing flow of a substrate in the plating apparatus according to the present embodiment will be described below. Substrates are accommodated in a substrate cassette in such a state that front surfaces of the substrates (surfaces on which semiconductor devices are formed, i.e., surfaces to be processed) face upwardly, and the substrate cassette accommodating such substrates is placed on a cassette stage 15. The first transfer device 17 removes a substrate from the substrate cassette, moves to the second substrate stage 26a, and places the substrate on the second substrate stage 26a. Then, the third transfer device 27 transfers the substrate from the second substrate stage 26a to the first substrate stage 23a. Thereafter, the second transfer device 24 receives the substrate from the first substrate stage 23a and transfers the substrate to pre-treatment unit 21. After pre-treatment of the substrate is completed in the pre-treatment unit 21, the substrate is inverted by inverter 20 so that the front surface of the substrate faces downwardly, and is then transferred to the second transfer device 24. The second transfer device 24 transfers the substrate to a head of plating unit 22.

After the substrate is plated and liquid on the substrate is removed in the plating unit 22, the substrate is received by the second transfer device 24, which transfers the substrate to the first substrate stage 23b. The substrate is inverted by inverter 20 provided at the first substrate stage 23b so that the front surface faces upwardly, and is then transferred to chemical liquid cleaning unit 25 by the third transfer device 27. In the chemical liquid cleaning unit 25, the substrate is cleaned with chemical liquid and rinsed with pure water, and then liquid on the substrate is removed by spinning the substrate. Thereafter, the substrate is transferred to the second substrate stage 26b by the third transfer device 27. Next, the first transfer device 17 receives the substrate from the second substrate stage 26b, and transfers the substrate to cleaning and drying unit 16. In the cleaning and drying unit 16, the substrate is rinsed with pure water and then spin-dried. The dried substrate is returned to the substrate cassette placed on the cassette stage 15 by the first transfer device 17.

Figure 3:
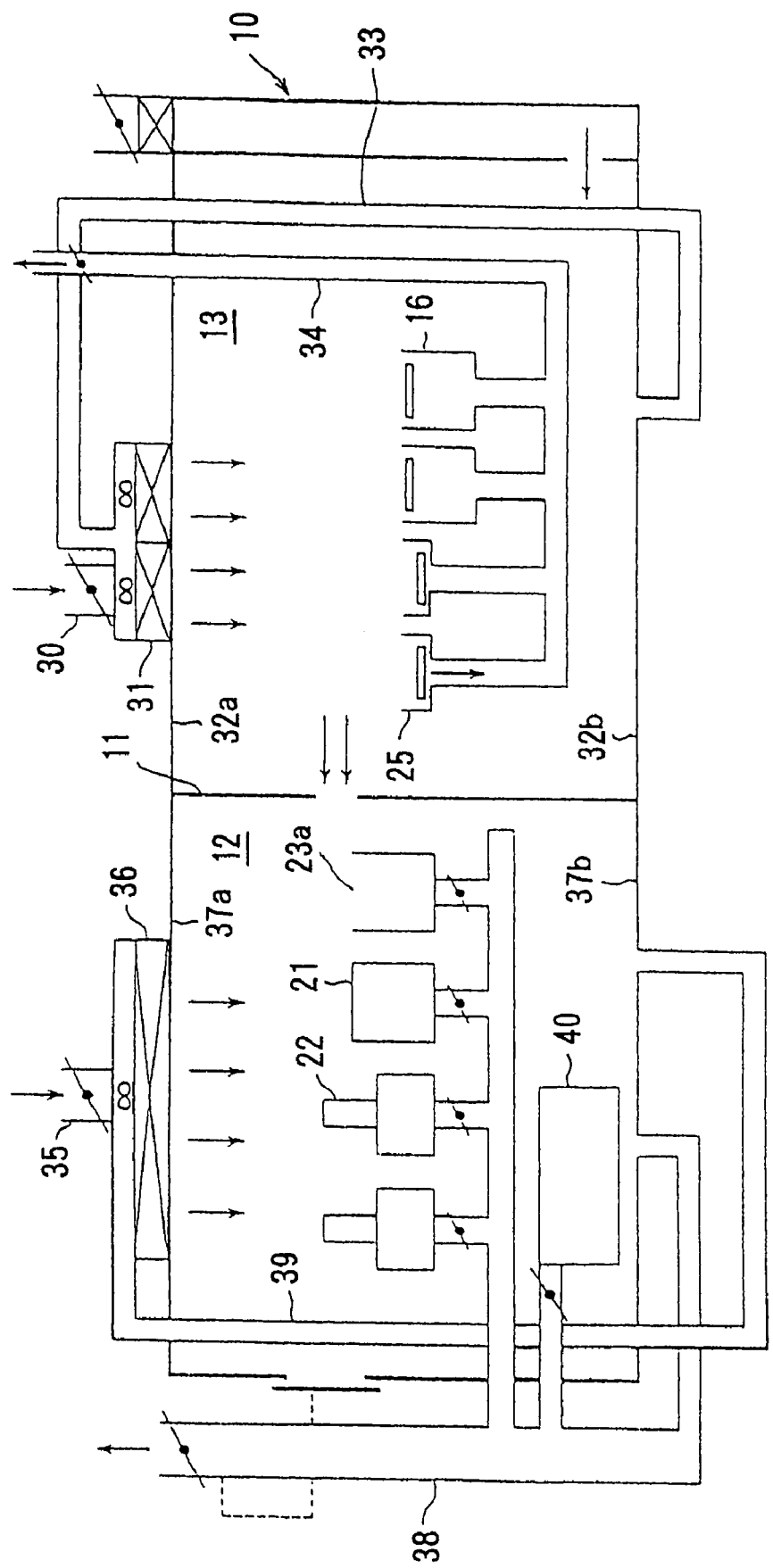
FIG. 3 is an explanatory view showing an air current in the plating apparatus shown in FIG. 2.

FIG. 3 is a schematic view showing an air current in the facility 10. In the clean section 13, a fresh external air is introduced through a pipe 30 and pushed into the clean section 13 through a high-performance filter 31 by a fan. Hence, down-flow clean air is supplied from a ceiling 32a to positions around the cleaning and drying units 16 and the chemical liquid cleaning units 25. A large part of the supplied clean air is returned from a floor 32b through a circulation pipe 33 to the ceiling 32a, and pushed again into the clean section 13 through the high-performance filter 31 by the fan, to thus circulate in the clean section 13. A part of the air is discharged from the cleaning and drying units 16 and the chemical cleaning liquid units 25 through a pipe 34 to an exterior of the clean section 13, so that pressure of the clean section 13 is set to be lower than atmospheric pressure.

The plating section 12 having the pre-treatment units 21 and the plating units 22 therein is not a clean section (but a contamination zone). However, it is not acceptable to attach particles to a surface of a substrate. Therefore, in the plating section 12, fresh external air is introduced through a pipe 35, and down-flow clean air is pushed into the plating section 12 from ceiling 37a through a high-performance filter 36 by a fan, for thereby preventing particles from being attached to the surface of the substrate. However, if the entire flow rate of the down-flow clean air is supplied by only an external air supply and exhaust, then enormous air supply and exhaust are required. Therefore, air is discharged through a pipe 38 to an exterior of the plating section 12, and a large part of down-flow clean air is supplied by circulating air through a circulation pipe 39 extended from a floor 37b, in such a state that pressure of the plating section 12 is maintained to be lower than pressure of the clean section 13.

Thus, air returned to a ceiling 37a through the circulation pipe 39 is pushed again into the plating section 12 through the high-performance filter 36 by the fan. Hence, clean air is supplied into the plating section 12 to thus circulate in the plating section 12. In this case, air containing chemical mist or gas emitted from the pre-treatment units 21, the plating units 22, the second transfer device 24, and a plating liquid regulating tank 40 is discharged through the pipe 38 to the exterior of the plating section 12. Thus, pressure of the plating section 12 is controlled so as to be lower than pressure of the clean section 13.

Figure 4:
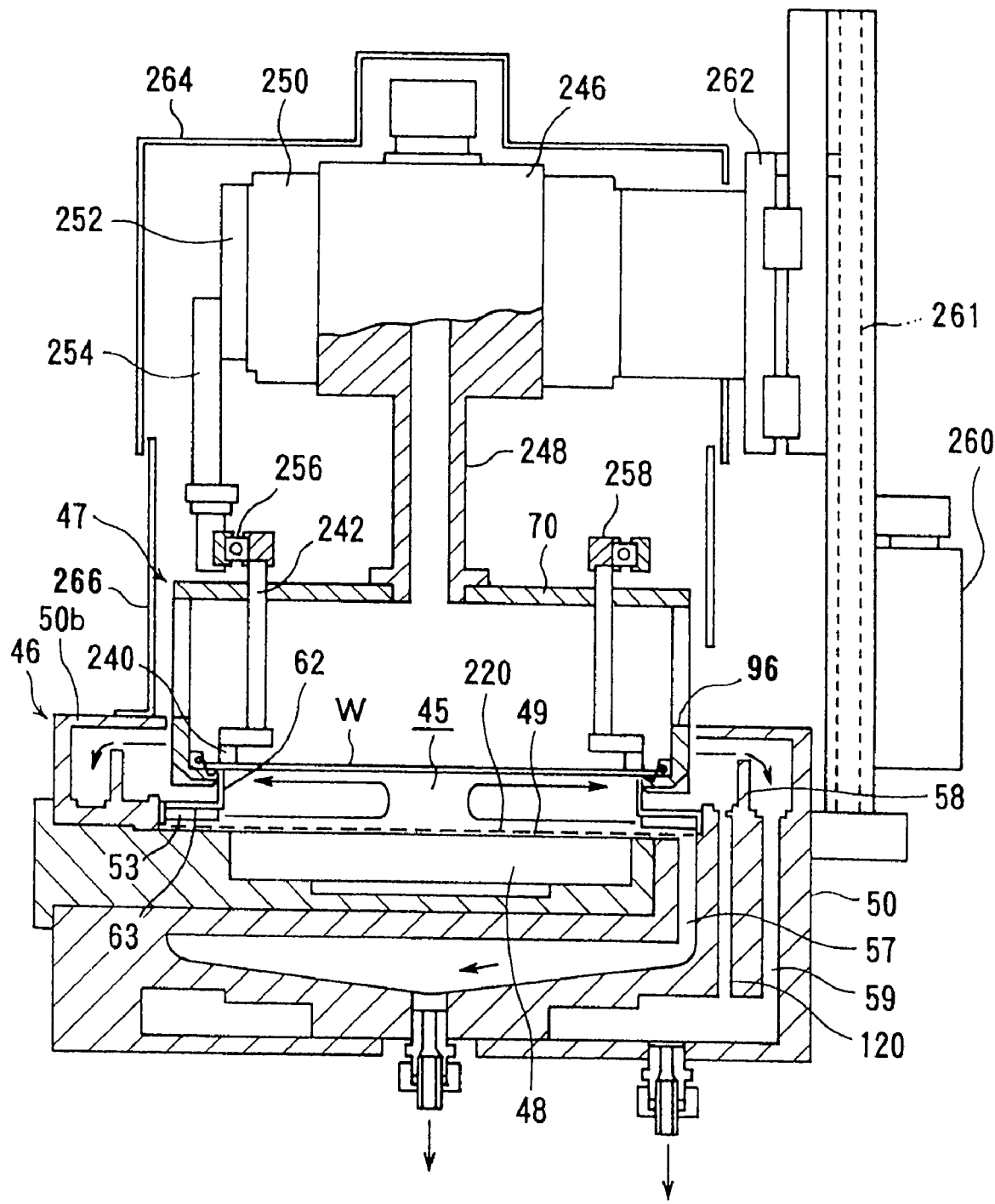
FIG. 4 is a cross-sectional view showing an entire structure of a plating unit at a time of performing a plating process in the plating apparatus shown in FIG. 2.

FIG. 4 shows a main part of the plating unit 22. Plating unit 22 mainly comprises a plating process container 46 of a substantially cylindrical form for holding a plating liquid therein, and a head 47 disposed above the plating process container 46 for holding a substrate. In FIG. 4, the head 47 is located in a plating position in which a substrate W held by the head 47 is lowered.

The plating process container 46 is provided with a plating container 50 including a plating chamber 49, which is upwardly opened, for holding a plating liquid therein. An anode 48 made of residual-phosphorus copper, for example, is provided at a bottom of the plating chamber 49. The anode 48 is made of copper containing 0.03% to 0.05% phosphorus (residual-phosphorus copper), and hence a black film is formed on an upper surface of the anode 48 as plating proceeds. Such a black film can reduce generation of anode slime.

Plating solution supply nozzles 53 horizontally projecting toward a center of the plating chamber 49 are provided on an inner circumferential wall of the plating container 50 at equal intervals along a circumferential direction. Each of the plating liquid supply nozzles 53 is communicated with a plating liquid supply passage extended vertically through an interior of the plating container 50.

Further, according to this embodiment, a punch plate 220 having a large number of holes with a size of, for example, about 3 mm is disposed at a position above the anode 48 within the plating chamber 49. The punch plate 220 prevents a black film formed on the upper surface of the anode 48 from curling up by the plating liquid 45 and consequently being flowed out.

The plating container 50 has first plating liquid discharge ports 57 for withdrawing plating liquid 45 contained in the plating chamber 49 from a peripheral portion of the bottom of the plating chamber 49, and second plating liquid discharge ports 59 for discharging plating liquid 45 which has overflowed a weir member 58 provided at an upper end of the plating container 50. Further, the plating container 50 has third plating liquid discharge ports 120 for discharging plating liquid before overflowing the weir member 58. Plating liquid which has flowed through the second plating liquid discharge ports 59 and the third plating liquid discharge ports 120 join at a lower end of the plating container 50, and then is discharged from the plating container. Instead of providing the third plating liquid discharge ports 120, as shown in FIGS. 10A through 10D, the weir member 58 may have, in its lower part, openings 222 having a predetermined width at predetermined intervals so that the plating liquid 45 passes through the openings 222 and is then discharged to the second plating liquid discharge ports 59.

Figure 10A:
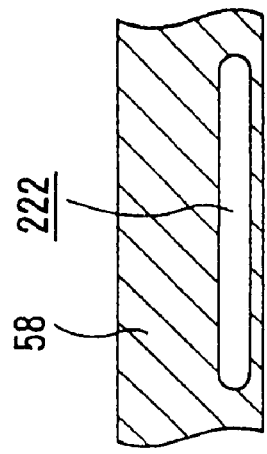
FIGS. 10A through 10D are schematic explanatory views of flow of a plating liquid at a time of performing a plating process and at a time of not performing a plating process.
Figure 10C:
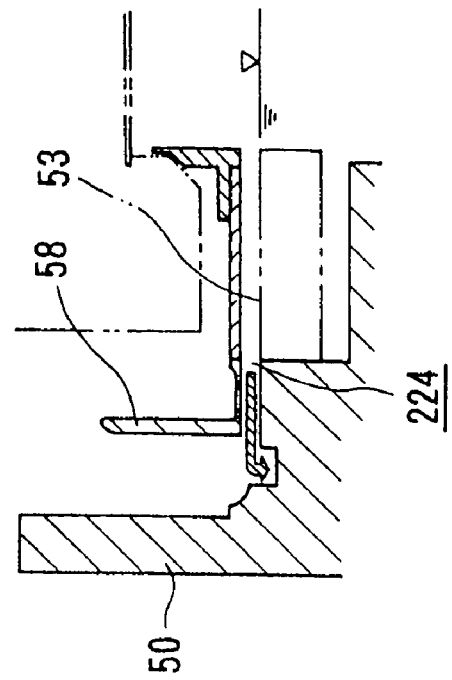
Figure 10B:
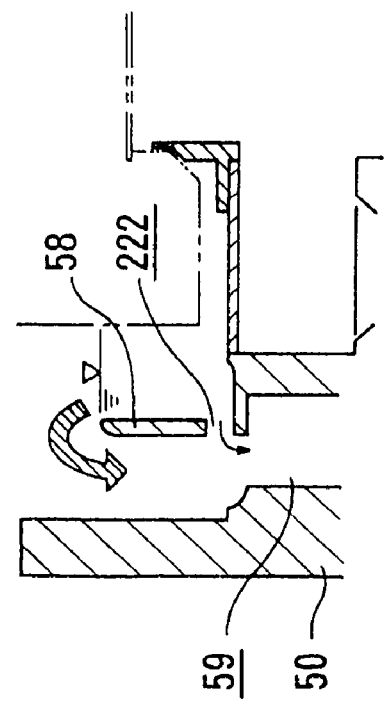

With this arrangement, when an amount of plating liquid supplied is large during plating, the plating liquid is discharged to an exterior of the plating unit 22 through the third plating liquid discharge ports 120, or is passed through the openings 222 and discharged to the exterior of the plating unit through the second plating liquid discharge ports 59 and, in addition, as shown in FIG. 10A, the plating liquid overflows the weir member 58 is discharged to the exterior of the plating unit through the second plating liquid discharge ports 59. On the other hand, during plating, when an amount of plating liquid supplied is small, the plating liquid is discharged to an exterior of the plating unit through the third plating liquid discharge ports 120, or alternatively as shown in FIG. 10B, the plating liquid is passed through the openings 222 and discharged to the exterior of the plating unit through the second plating liquid discharge ports 59. In this manner, this construction can easily cope with a case where an amount of plating liquid supplied is large or small.

Figure 10D:
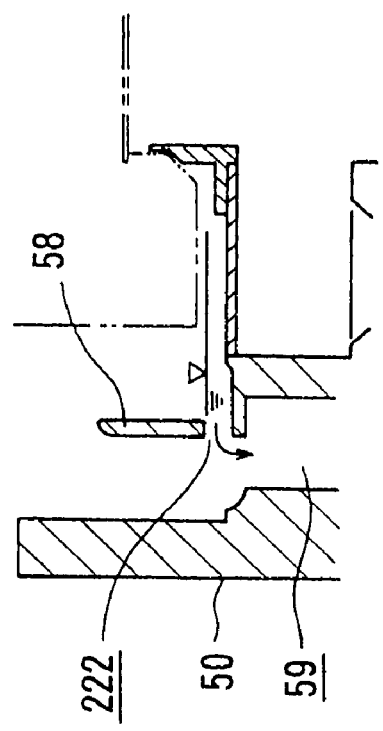

Further, as shown in FIG. 10D, through holes 224 for controlling a liquid level, which are located above the plating liquid supply nozzles 53, and communicate with the plating chamber 49 and the second plating liquid discharge ports 59, are provided at circumferentially predetermined pitches. Thus, when plating is not performed, the plating liquid is passed through the through holes 224, and is discharged to the exterior of the plating unit through the second plating liquid discharge ports 59, thereby controlling a liquid level of the plating liquid. During plating, the through holes 224 serve as an orifice for restricting an amount of plating liquid flowing therethrough.

Figure 5:
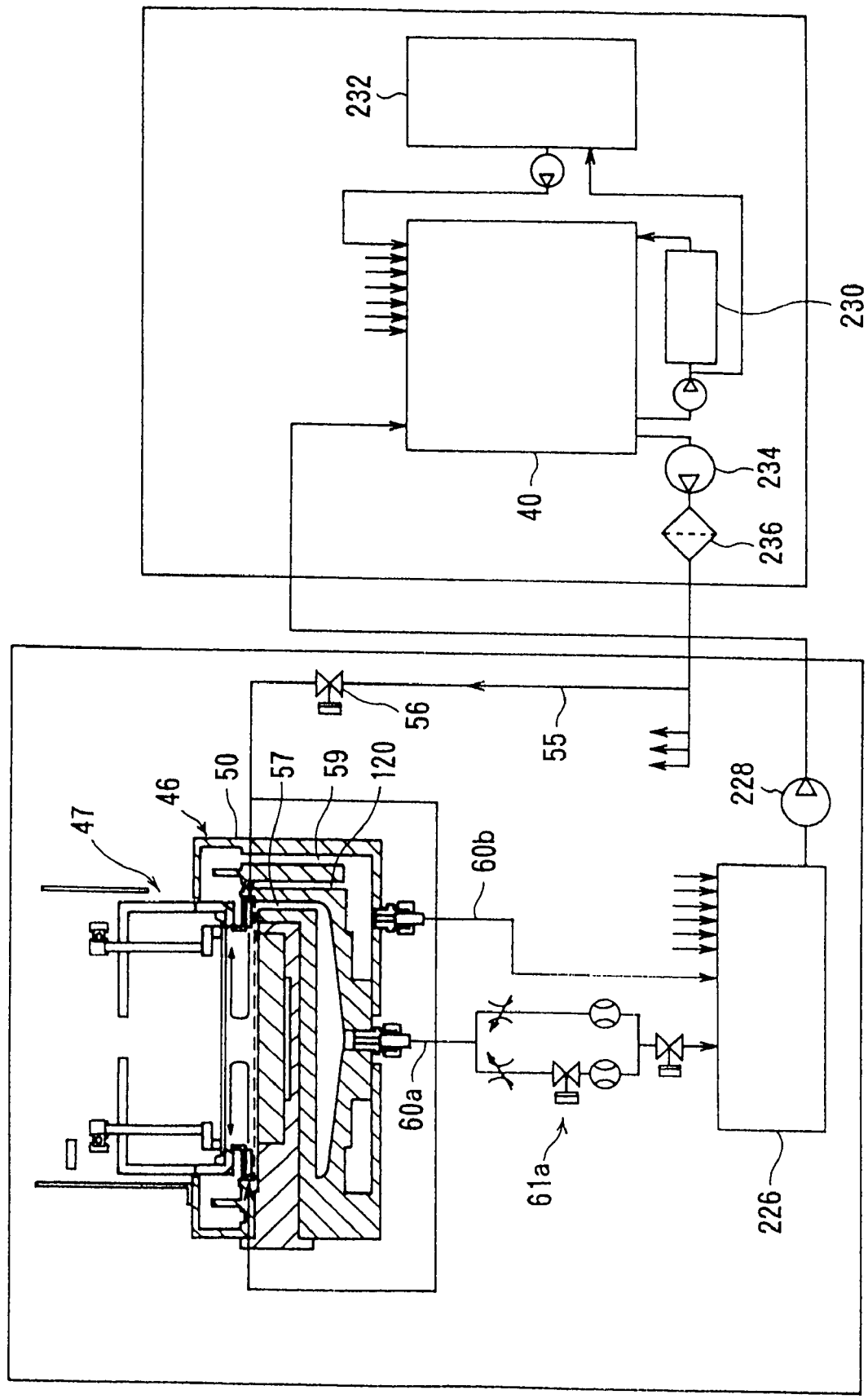
FIG. 5 is a schematic diagram showing flow of a plating liquid in the plating apparatus shown in FIG. 2.

As shown in FIG. 5, the first plating liquid discharge ports 57 are connected to reservoir 226 through plating liquid discharge pipe 60*a*, and a flow controller 61*a* is provided in the plating liquid discharge pipe 60*a*. The second plating liquid discharge ports 59 and the third plating liquid discharge ports 120 join with each other within the plating container 50, and a joined passage is then connected directly to the reservoir 226 through the plating liquid discharge pipe 60*b*.

The reservoir 226 is constructed so that plating liquid from all the plating units flows into the reservoir 226. Plating liquid which has flowed into the reservoir 226 is introduced by a pump 228 into the plating liquid regulating tank 40 (see FIG. 3). This plating liquid regulating tank 40 is provided with a temperature controller 230, and a plating liquid analyzing unit 232 for sampling plating liquid and analyzing a sample solution. When a single pump 234 is operated, plating liquid is supplied from the plating liquid regulating tank 40 through filter 236 to the plating liquid supply nozzles 53 in each of the plating units. A control valve 56 is provided in plating liquid supply pipe 55 extending from the plating liquid regulating tank 40 to each of the plating units. This control valve 56 serves to make pressure on a secondary side constant, and, even when one plating unit is stopped, the control valve 56 can make supply pressure of plating liquid in the other plating units constant.

Thus, a plating liquid prepared in a plating liquid regulating tank 40 in a single plating process system is fed to a plurality of plating units through a single pump 234. The plating liquid preparation tank 40 having a large capacity is used in a plating process system to prepare a plating liquid. With this arrangement, plating liquid is fed to each of the plating units while controlling flow rate in each of the plating units through control valves 56, and a variation of the plating liquid with regard to quality can be suppressed.

As shown in FIG. 4 a vertical stream regulating ring 62 and a horizontal stream regulating ring 63 are disposed within the plating chamber 49 at a position near an internal circumference of the plating chamber 49, and a central portion of a liquid surface is pushed up by an upward stream out of two divided upward and downward streams of plating liquid 45 within the plating chamber 49, whereby downward flow is smoothened and distribution of current density is further uniformized. The horizontal stream regulating ring 63 has a peripheral portion which is fixed to the plating container 50, and the vertical stream regulating ring 62 is connected to the horizontal stream regulating ring 63.

Figure 8:
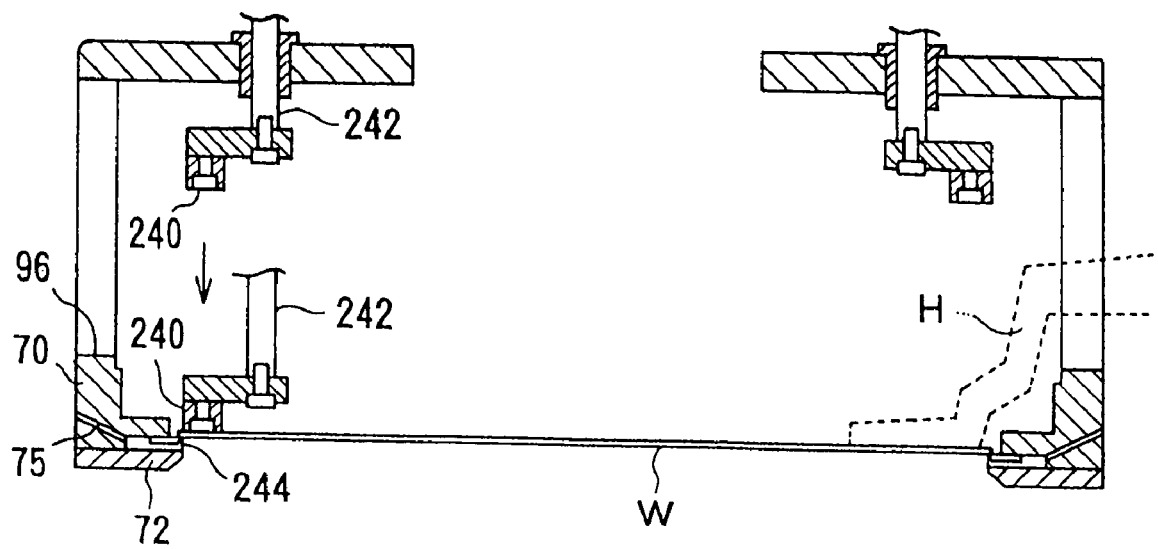
FIG. 8 is a cross-sectional explanatory view of a relationship among a housing, a pressing ring, and a substrate at a time of transfer of the substrate.
Figure 9:
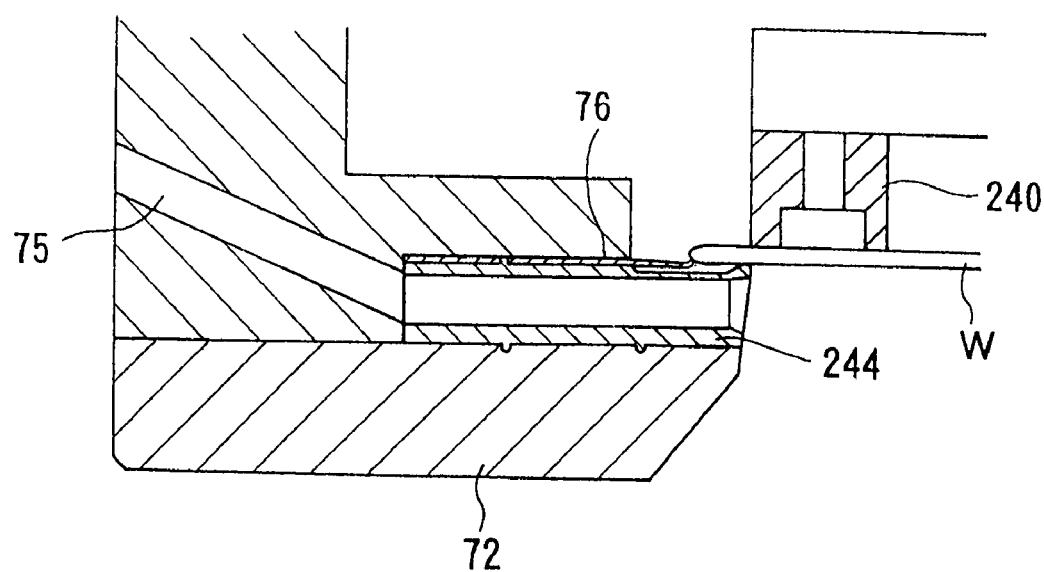
FIG. 9 is an enlarged view showing a part of FIG. 8.

On the other hand, the head 47 comprises a housing 70 which is a rotatable and cylindrical receptacle having a downwardly open end and openings 96 on a circumferential wall thereof, and vertically movable pressing rods 242 having, at their lower ends, respectively, pressing rings 240. As shown in FIGS. 8 and 9, an inwardly projecting ring-shaped substrate holding member 72 is provided at a lower end of the housing 70. A ring-shaped sealing member 244 is mounted on the substrate holding member 72. The ring-shaped sealing member 244 projects inwardly, and a front end of a top surface of the ring-shaped sealing member 244 projects upwardly in an annular tapered form. Further, contacts 76 for a cathode electrode are disposed above the sealing member 244. Air vent holes 75, which extend outwardly in a horizontal direction and further extend outwardly in an upwardly inclined state, are provided in the substrate holding member 72 at circumferentially equal intervals.

Figure 6:
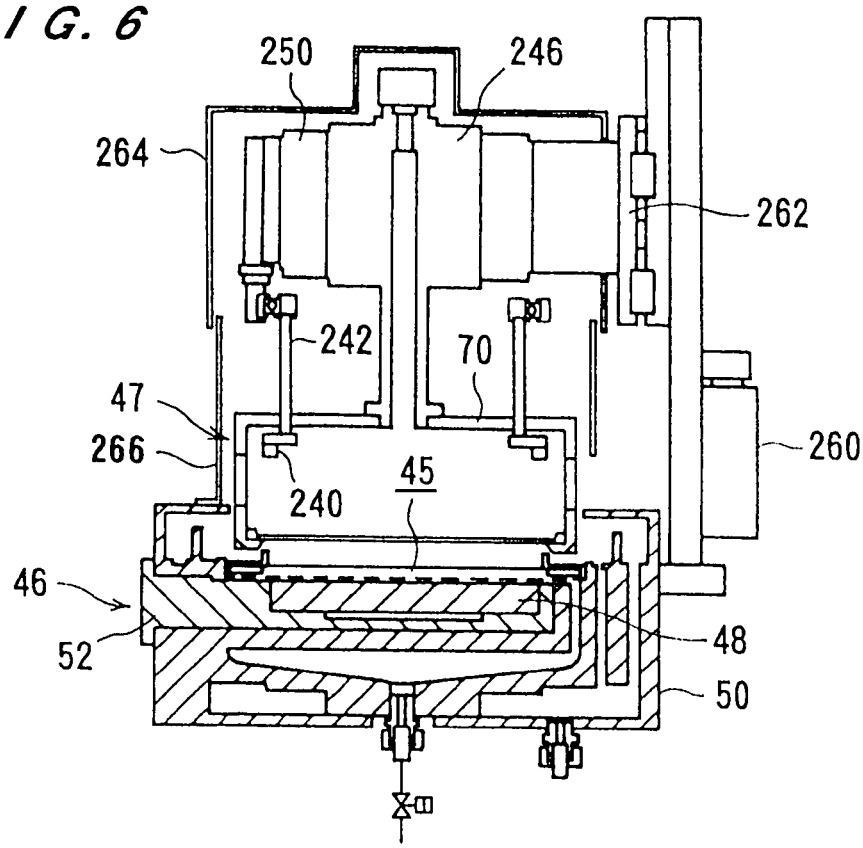
FIG. 6 is a cross-sectional view showing an entire structure of the plating unit at a time of not performing a plating process (at a time of transfer of a substrate)

With this arrangement, as shown in FIG. 6, a liquid level of plating liquid is lowered, and as shown in FIGS. 8 and 9, substrate W is held by a robot hand H or the like, and is inserted into the housing 70 where the substrate W is placed on an upper surface of the sealing member 244 of the substrate holding member 72. Thereafter, the robot hand H is withdrawn from the housing 70, and pressing ring 240 is then lowered to sandwich a peripheral portion of the substrate W between the sealing member 244 and a lower surface of the pressing ring 240, thereby holding the substrate W. In addition, upon holding of the substrate W, a lower surface of the substrate W is brought into pressure contact with the sealing member 244 to seal this contact portion positively. At the same time, current flows between the substrate W and the contacts 76 for a cathode electrode.

Returning to FIG. 4, the housing 70 is connected to an output shaft 248 of a motor 246, and rotated by energization of the motor 246. The pressing rods 242 are vertically provided at predetermined positions along a circumferential direction of a ring-shaped support frame 258 rotatably mounted through a bearing 256 on a lower end of a slider 254. The slider 254 is vertically movable by actuation of a cylinder 252, with a guide, fixed to a support 250 surrounding the motor 246. With this construction, the pressing rods 242 are vertically movable by actuation of the cylinder 252, and, in addition, upon holding of the substrate W, the pressing rods 242 are rotated integrally with the housing 70.

The support 250 is mounted on a slide base 262 which is engaged with a ball screw 261 and vertically movable by the ball screw 261 rotated by energization of the motor 260. The support 250 is surrounded by an upper housing 264, and is vertically movable together with the upper housing 264 by energization of the motor 260. Further, a lower housing 266 for surrounding the housing 70 during plating is mounted on an upper surface of the plating container 50.

Figure 7:
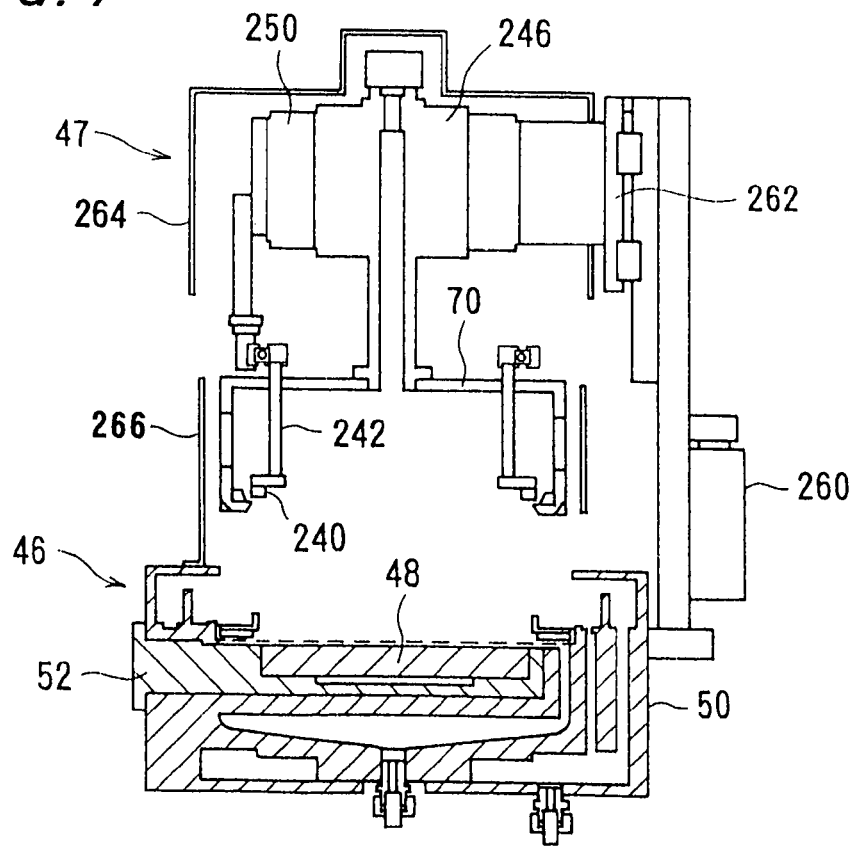
FIG. 7 is a cross-sectional view showing an entire structure of the plating unit at a time of maintenance.

With this construction, as shown in FIG. 7, maintenance can be performed in such a state that the support 250 and the upper housing 264 are raised. A crystal of plating liquid is likely to deposit on an inner circumferential surface of the weir member 58. However, when the support 250 and the upper housing 264 are raised, a large amount of plating liquid is flowed and overflows the weir member 58, and hence the crystal of the plating liquid is prevented from being deposited on the inner circumferential surface of the weir member 58. A cover 50b for preventing splashing of plating liquid is integrally provided in the plating container 50 to cover a portion above plating liquid which overflows during a plating process. By coating an ultra-water-repellent material such as HIREC (manufactured by NTT Advance Technology) on a lower surface of the cover 50b for preventing splashing of plating liquid, a crystal of the plating liquid can be prevented from being deposited on the lower surface of the cover 50b.

Figure 13:
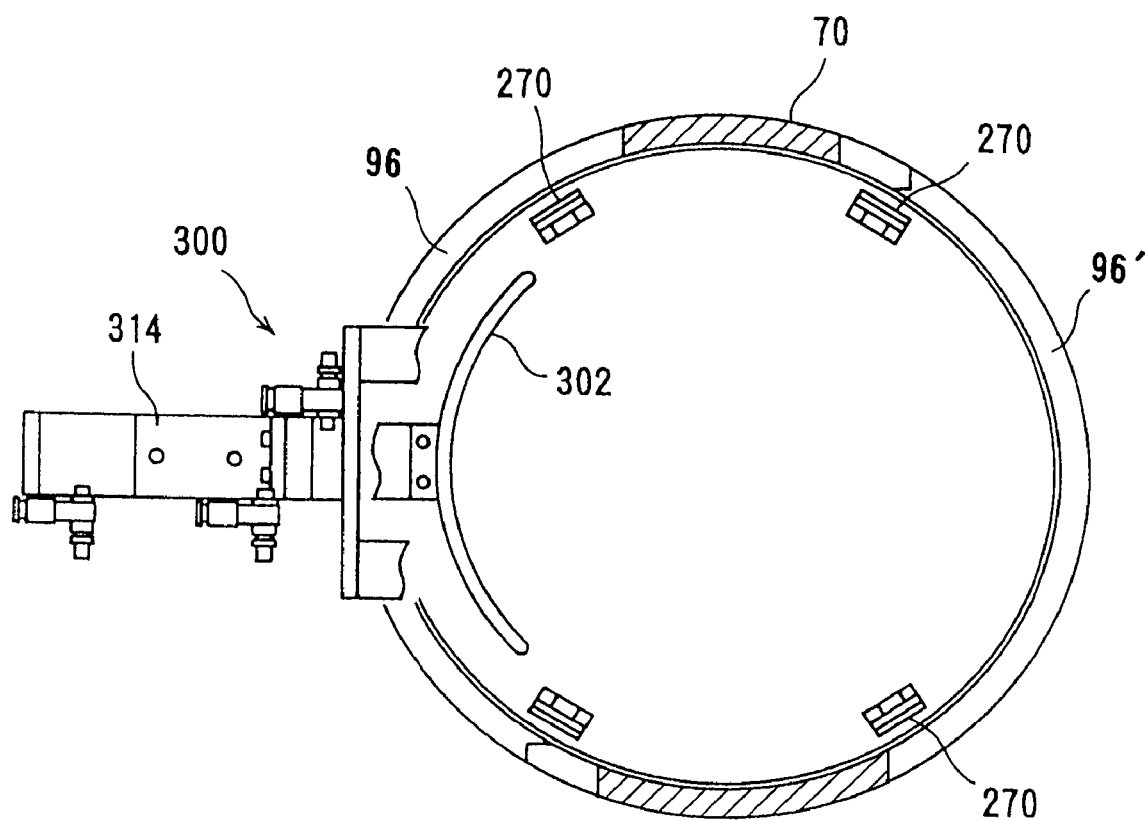
FIG. 13 is a plan view showing a plating liquid removing mechanism in the plating unit.

Substrate centering mechanisms 270 located above the substrate holding member 72 of the housing 70 for performing centering of substrate W, are provided at four places along a circumferential direction of the housing in this embodiment (see FIG. 13).

Figure 11:
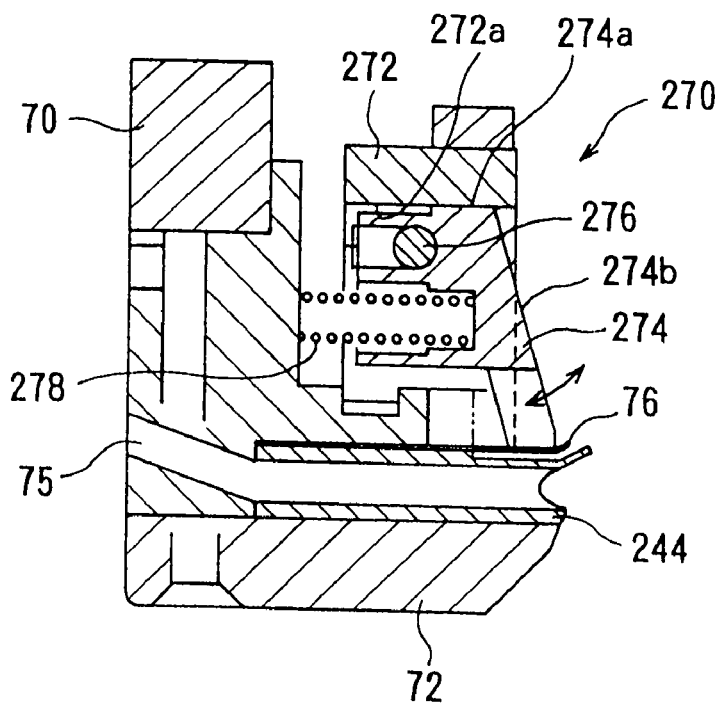
FIG. 11 is an enlarged cross-sectional view showing a centering mechanism in the plating unit.

FIG. 11 shows substrate centering mechanism 270 in detail. Each substrate centering mechanism 270 comprises a gate-like bracket 272 fixed to the housing 70, and a positioning block 274 disposed within the bracket 272. This positioning block 274 is swingably mounted through a support shaft 276 horizontally fixed to the bracket 272 at its upper part. Further, a compression coil spring 278 is interposed between the housing 70 and the positioning block 274. Thus, the positioning block 274 is urged by the compression coil spring 278 so that the positioning block 274 rotates about the support shaft 276, and a lower portion of the positioning block 274 projects inwardly. Upper surface 274a of the positioning block 274 serves as a stopper, and is brought into contact with lower surface 272a of the bracket 272 to restrict movement of the positioning block 274. Further, the positioning block 274 has a tapered inner surface 274b which is widened outwardly in an upward direction.

With this construction, a substrate is held by the hand H of a transfer robot or the like, is carried into the housing 70, and is placed on the substrate holding member 72 (see FIG. 8). In this case, when a center of the substrate deviates from a center of the substrate holding member 72, the positioning block 274 is rotated outwardly against an urging force of the compression coil spring 278 and, upon the release of holding of the substrate from the hand of the transfer robot or the like, the positioning block 274 is returned to an original position by the urging force of the compression coil spring 278. Thus, centering of the substrate can be performed.

Figure 12:
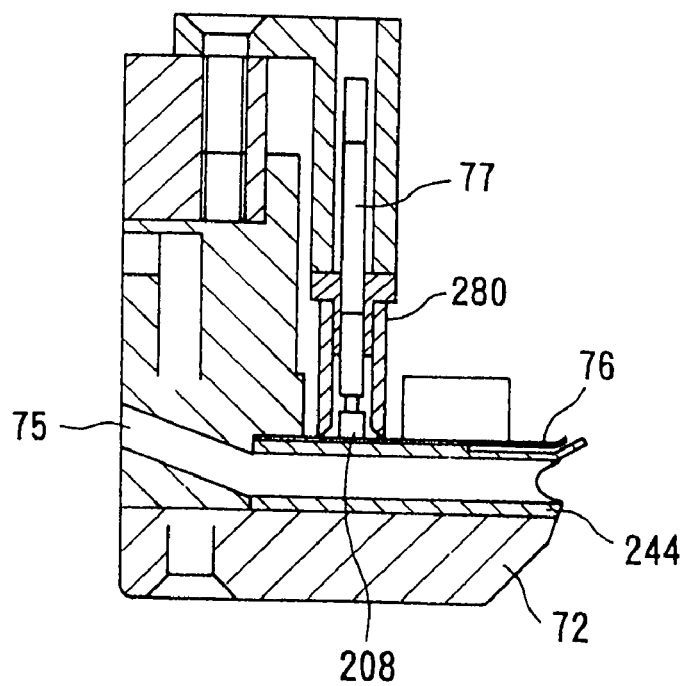
FIG. 12 is a cross-sectional view showing a feeding contact (probe) in the plating unit.

FIG. 12 shows a feeding contact (a probe) 77 for feeding power to a cathode electrode plate 208 of a contact 76 for a cathode electrode. This feeding contact 77 is composed of a plunger and is surrounded by a cylindrical protective member 280 extending to the cathode electrode plate 208, whereby the feeding contact 77 is protected against plating liquid.

In this case, when a plating process is performed, an annular substrate-contacting portion 360 (see FIGS. 16A-16C) projecting from an inner circumferential surface of the sealing member 244, is pressed against a surface, to be plated, of the substrate. An inner side of the substrate-contacting portion 360 is filled with plating liquid. Therefore, plating liquid remains on the substrate-contacting portion or portions in its vicinity. This plating liquid, upon drying, becomes a source for particles. For this reason, in this embodiment, a plating liquid removing mechanism 300 is provided for removing plating liquid remaining on the substrate-contacting portion, or the portions in its vicinity, of the sealing member 244.

Figure 14:
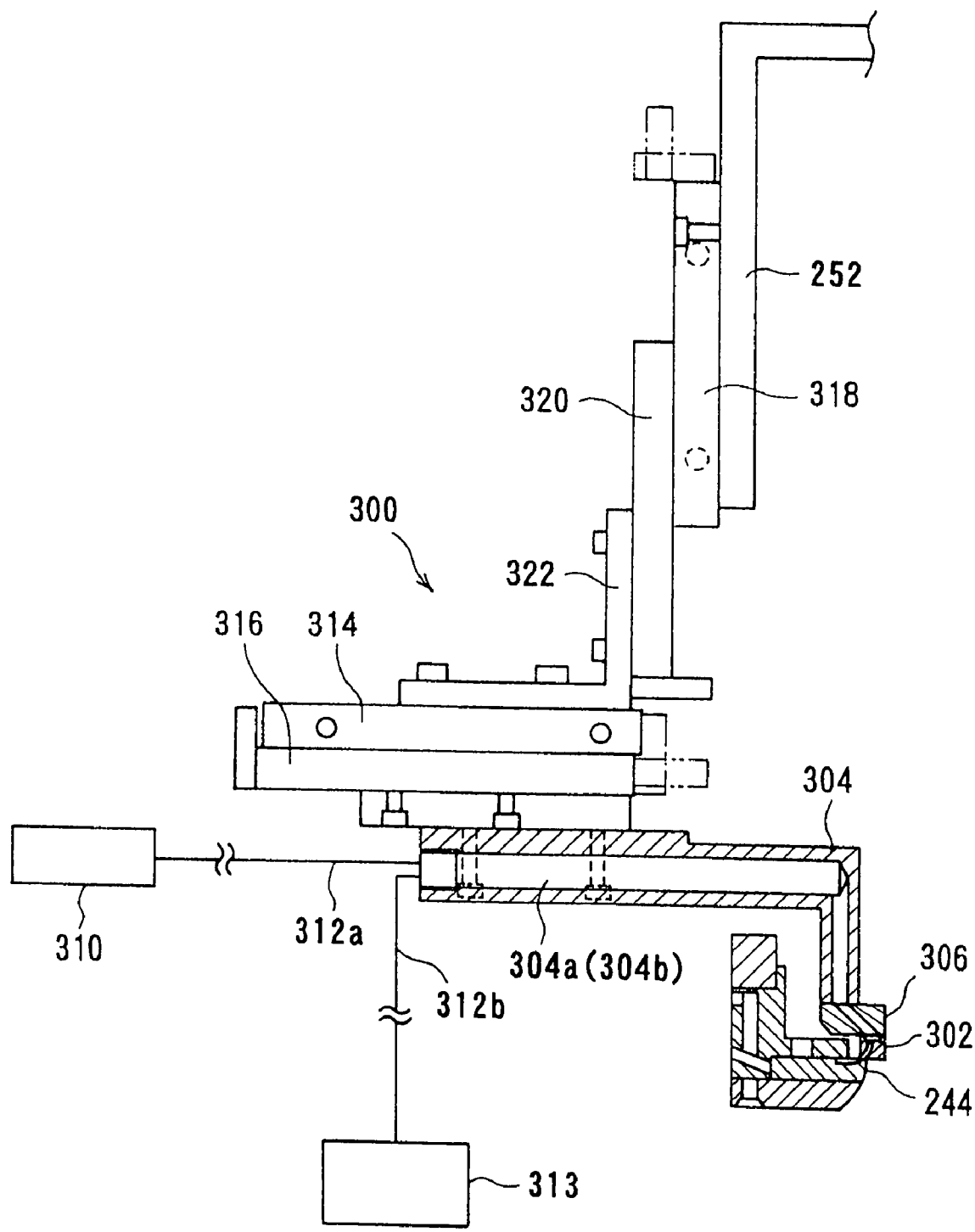
FIG. 14 is a front view showing the plating liquid removing mechanism shown in FIG. 13.
Figure 15:
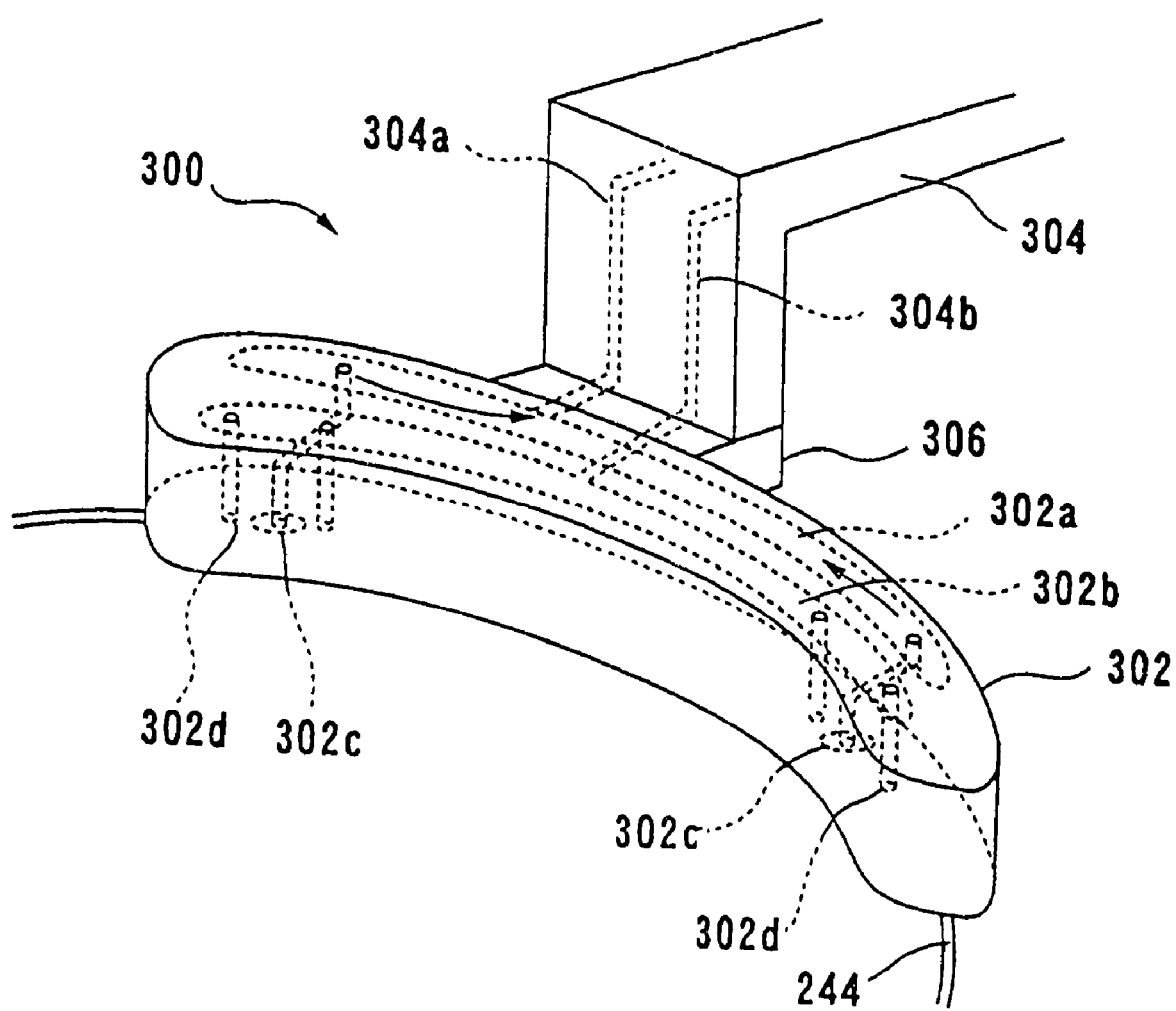
FIG. 15 is a perspective view of a main portion of the plating liquid removing mechanism.

FIGS. 13 through 15 show the plating liquid removing mechanism 300. The plating liquid removing mechanism 300 includes a nozzle head 302 of an arc shape with a central angle of e.g. about 100° extending along the substrate-contacting portion 360 at an inner circumferential edge of the sealing member 244. Inside the nozzle head 302, a plating liquid passage 302a and a cleaning liquid passage 302b are formed substantially in parallel, extending in a long direction of the nozzle head 302. At each end of the nozzle head 302, there is provided a bottom-opened suction nozzle 302c that communicates with the plating liquid passage 302a, and two bottom-opened cleaning liquid injection nozzles 302d that communicate with the cleaning liquid passage 302b. The cleaning liquid injection nozzles 302d are disposed on both sides of the plating liquid suction nozzles 302c at each end of the nozzle head 302.

The nozzle head 302 is connected, through a block 306, to a lower end of a nozzle support 304 that extends horizontally and turns halfway down to a vertical direction and extends downwardly. Inside the nozzle support 304, there are formed a plating liquid passage 304a and a cleaning liquid passage 304b, which respectively communicate with the plating liquid passage 302a and the cleaning liquid passage 302b. The plating liquid passage 304a is connected, via a flexible tube 312a, to a vacuum source 310; and the cleaning liquid passage 304b is connected, via a flexible tube 312b, to a cleaning liquid supply source 313.

The nozzle support 304 is connected to a horizontal slider 316 that moves horizontally by the actuation of a cylinder 314 for horizontal movement. The cylinder 314 for horizontal movement is connected, through a hooked bracket 322, to a vertical slider 320 that moves vertically by actuation of a cylinder 318 for vertical movement. The cylinder 318 for vertical movement is mounted on the above described support 250. Therefore, the nozzle head 302 is horizontally and vertically movable.

Figure 16A:
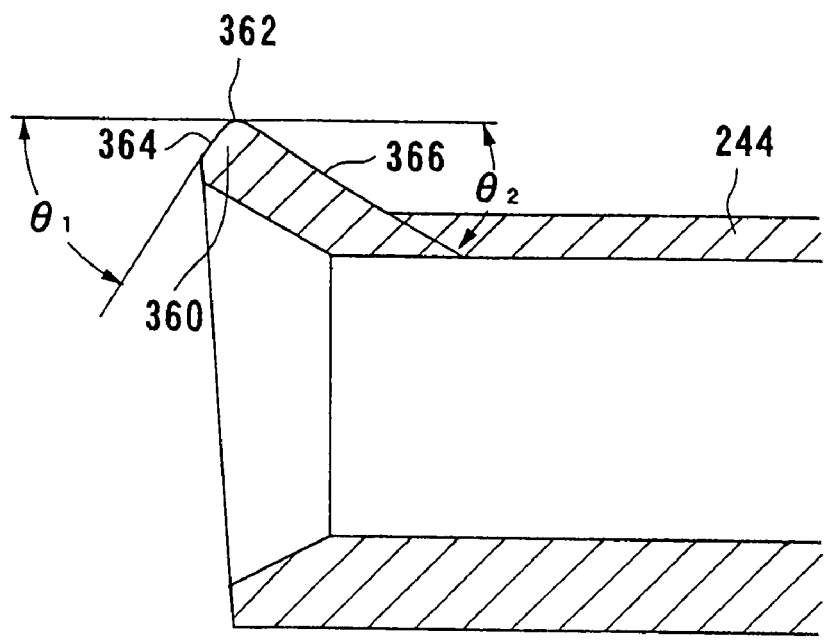
FIGS. 16A through 16C are enlarged cross-sectional views of a main portion of a sealing member.
Figure 16B:
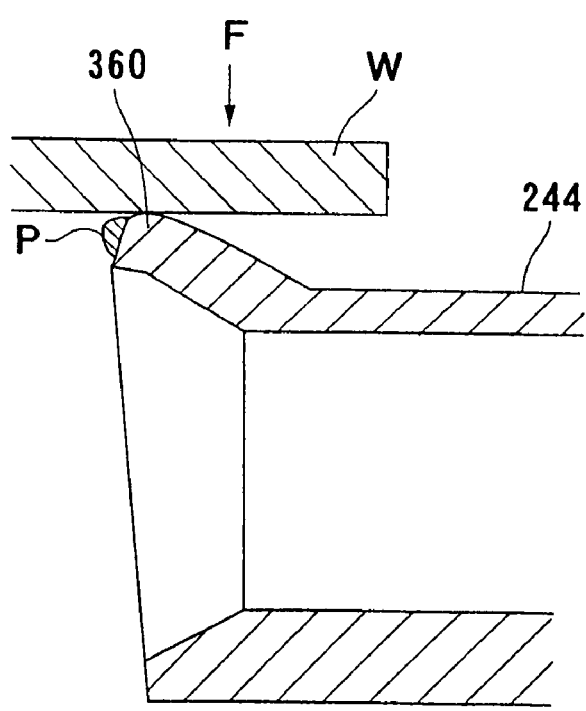
Figure 16C:
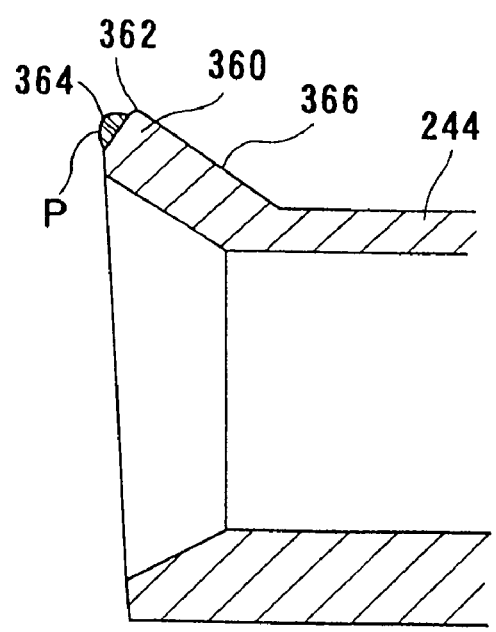

FIGS. 16A-16C are enlarged views of a main portion of the sealing member 244. Substrate-contacting portion 360, which has a shape of a spire in cross section and projects upwardly, is formed at the inner circumferential upper edge of the sealing member 244. An outline of the substrate-contacting portion 360 is defined by: a top flat surface 362 which is positioned slightly outwardly from a plane extending upwardly from an inner circumferential end surface of the sealing member 244 and extends horizontally; a reverse tapered surface 364 which makes an acute angle $\theta_1$ with a horizontal plane and extends inwardly from the top flat surface 362; and a tapered surface 366 which makes an acute angle $\theta_2$ with a horizontal plane and extends outwardly from the top flat surface 362. Thus, the substrate-contacting portion 360 has a shape of an acute-angle triangle in cross section, with its top being flattened. The angle $\theta_1$ between the reverse tapered surface 364 and the horizontal plane is designed to be larger than the angle $\theta_2$ between the tapered surface 366 and the horizontal plane($\theta_1 > \theta_2$).

Due to this specific configuration, the substrate-contacting portion 360 of the sealing member 244 possesses an enhanced rigidity. Further, provision of the reverse tapered surface 364 on an inner plating liquid-contacting side can keep plating liquid on the inner reverse tapered surface 364, after a plating treatment, thus not allowing the plating liquid to flow to an outer side. Thus, as shown in FIG. 16B, when plating is performed while contacting substrate W with the substrate-contacting portion 360 and pressing the substrate W by applying a sufficient load F to fully seal an outer peripheral edge of the substrate W, the plating liquid P stays between the substrate W and the reverse tapered surface 364. After the substrate W is removed, the plating liquid P is stemmed by the top flat surface 362 and prevented from flowing down to an outer electrical contact side.

Figure 17A:
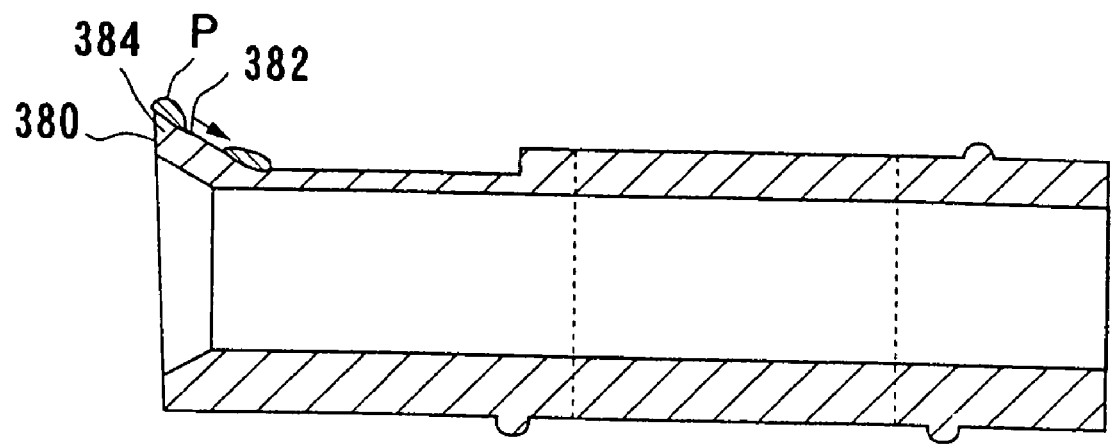
FIGS. 17A and 17B are diagrams illustrating problems encountered upon using a conventional sealing member.
Figure 17B:
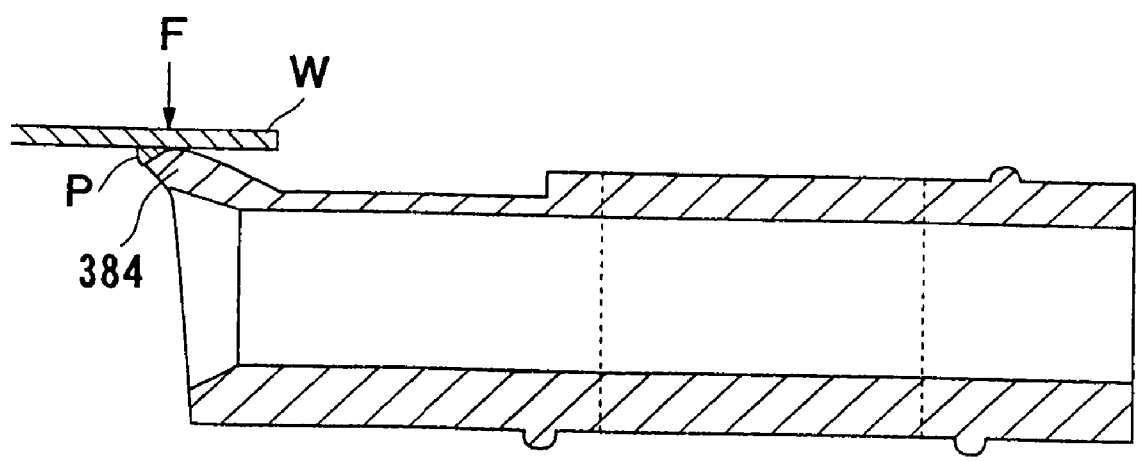

In a case of a conventional sealing member commonly used, as shown in FIGS. 17A and 17B, the sealing member has a substrate-contacting portion (sealing portion) 384 which has a shape of an obtuse-angle triangle, in cross section, with two tapered surfaces 380 and 382 making an obtuse angle with each other. A substrate is sealed at a pointed top of the substrate-contacting portion 384. When plating is performed while contacting substrate W with the substrate-contacting portion 384 and pressing the substrate W by applying a sufficient load F to fully seal an outer peripheral edge of the substrate W, as shown in FIG. 17B, a top of the substrate-contacting portion 384 is forced to hang down beneath the substrate W due to the load F, and plating liquid P remains between the substrate W and the thus hung portion of the sealing member. When the substrate W is removed and the substrate-contacting portion 384, due to its elasticity, is restored to an original state, the plating liquid P flows down to an outer electrical contact side, as shown in FIG. 17A.

Plating liquid, which has flown down to the outer electrical contact side, is hard to remove by suction and becomes a source of generating particles. Moreover, the plating liquid corrodes electrical contacts and, in addition, forms a local electric cell between the electrical contacts and the substrate-contacting portion 384, whereby an appearance of the substrate is deteriorated. According to this embodiment of the present invention, plating liquid is prevented from flowing to the outer electrical contact side, and therefore, the above drawbacks can be avoided.

Further, according to this embodiment, the sealing member 244 is made of a high-tearing strength silicone rubber that has a higher water-repellency than that of a fluorine rubber and an ethylene/propylene rubber, and has a sufficiently high tensile strength. Use of such a highly water-repellent sealing member 244, which is to be contacted with a substrate, can reduce an amount of plating liquid that remains on a surface of the substrate.

Specifically, conventional sealing members are generally made of a fluorine rubber or an ethylene/propylene rubber. FIG. 18 shows comparative data regarding a change of contact angle ($\theta$) between a sealing member made of a fluorine rubber and a sealing member made of a silicone rubber having a higher water-repellency, in which contact angle data for respective members after 762.65-hour dipping in a plating liquid is shown together with data for undipped members. As shown in FIG. 18, in the case of the sealing member made of fluorine rubber, the contact angle decreases from 80° (undipped member) to 76° (dipped member), indicating deterioration of water-repellency. In contrast, there is seen no substantial change in contact angle (from 91° to 92°) for the sealing member made of silicone rubber, thus indicating no deterioration of water-repellency.

Ordinary silicone rubbers have a tensile strength of about 8 MPa (80 kgf/cm$^2$), which is half the tensile strength of fluorine rubbers, i.e. about 16 MPa (160 kgf/cm$^2$). In the case of a high tearing-strength silicone rubber, on the other hand, this rubber has an enhanced tensile strength of about 10-12 MPa (100-120 kgf/cm$^2$). A sealing member made of this particular silicone rubber thus does not suffer from a shortage of strength.

Operation of plating unit 22 will now be described.

First, in transferring a substrate to plating unit 22, an attracting hand of the second transfer device 24 shown in FIG. 2, and substrate W attracted and held with its front surface facing downwardly by the attracting hand, are inserted into the housing 70 through opening 96, and the attracting hand is then moved downwardly. Thereafter, vacuum attraction is released to place the substrate W on the substrate holding member 72. The attracting hand is then moved upwardly and withdrawn from the housing 70. Thereafter, the pressing ring 240 is lowered down to a peripheral edge of the substrate W so as to hold the substrate W between the substrate holding member 72 and the lower surface of the pressing ring 240.

Plating liquid 45 is then spurted from the plating liquid supply nozzles 53 while, at the same time, the housing 70 and the substrate W held thereby are allowed to rotate at a middle speed (100-250 rev/min, e.g. 150 rev/min). When the plating chamber is charged with a predetermined amount of plating liquid 45, and further after an elapse of several seconds, a rotational speed of the housing 70 is decreased to a slow rotation (10-225 rev/min, e.g. 100 rev/min). Then, electroplating is carried out by flowing a plating current between the anode 48 and a surface, to be plated, of the substrate as a cathode.

After feed of the plating current, as shown in FIG. 10D, an amount of supply of plating liquid is decreased so that the plating liquid is allowed to flow out only through the through holes 224, for liquid level control, positioned above the plating liquid supply nozzles 53, thereby exposing the housing 70, together with the substrate held thereby, above a surface of the plating liquid. The housing 70 and the substrate W, positioned above the liquid surface, are allowed to rotate at a high speed (e.g. 500-1000 rev/min) to remove the plating liquid by action of centrifugal force. After completion of dewatering, rotation of the housing 70 is stopped so that the housing stops at a predetermined position.

After the housing 70 comes to a complete stop, the pressing ring 240 is moved upwardly. Thereafter, the attracting hand of the second transfer device 24 is inserted, with its attracting face directed downwardly, into the housing 70 through the opening 96 and is then lowered to a position at which the attracting hand can attract the substrate. After attracting the substrate by vacuum attraction, the attracting hand is moved upwardly to a position of the opening 96 of the housing 70, and is withdrawn, together with the substrate held by the hand, through the opening 96.

According to the plating unit 22, the head 47 can be designed to be compact and structurally simple. Further, plating can be performed when a surface of plating liquid in the plating process container 46 lies at a plating level, and dewatering and transfer of the substrate can be conducted when a surface of the plating liquid lies at a substrate transferring level. Moreover, black film formed on a surface of anode 48 can be prevented from being dried and oxidized.

When the above-described plating treatment is repeatedly performed, an amount of plating liquid remaining on the substrate-contacting portion 360, or portions in its vicinity, of the sealing member 244 gradually increases though the sealing member 244 used is made of a high-tearing strength silicone having a high water-repellency, and the plating liquid remaining on the substrate-contacting portion 360, or the portions in its vicinity, of the sealing member 244 is removed by centrifugal force by rotating the substrate at a high speed. Accordingly, for every several times (for example five times) of plating treatments, or at any time according to need, suction-removing of plating liquid remaining on the substrate-contacting portion 360, or the portions in its vicinity, of the sealing member 244 is conducted by using the plating liquid removing mechanism 300. A suction-removing treatment may of course be conducted for every plating treatment.

Specifically, dewatering (spin-drying) is performed by rotating the housing 70 at a high speed (500-1000 rev/mm) while the substrate is held by the substrate holding member 72, thereby removing superfluous plating liquid from the substrate and plating liquid remaining on the substrate-contacting portion 360, or portions in its vicinity, of the sealing member 244. After dewatering is completed and the substrate is removed from the housing 70, the cylinder 314 for horizontal movement is actuated to move the nozzle head 302 toward the housing 70 and introduce it into the housing 70 through the opening 96 of the housing 70. Thereafter, the cylinder 318 for vertical movement is actuated to lower the nozzle head 302 so that the nozzle head approaches and faces the substrate-contacting portion 360 of the sealing member 244.

In this state, while rotating the housing 70 slowly in both directions (1-10 rev/min), sucking of the plating liquid by the actuation of the vacuum source 310 is conducted and, at the same time, a jet of a cleaning liquid such as pure water is ejected from the cleaning liquid injection nozzles 302d toward the substrate-contacting portion 360, or portions in its vicinity, of the sealing member 244, thereby cleaning the substrate-contacting portion 360, or the portions in its vicinity, of the sealing member 244. Thus, plating liquid remaining on the substrate-contacting portion 360, or the portions in its vicinity, of the sealing member 244 is sucked, together with cleaning liquid used for cleaning of the sealing member 244, by the plating liquid suction nozzles 302c. This can prevent plating liquid from remaining inside the plating liquid suction nozzles 302c and clogging the nozzles when the plating liquid is dried.

The above suction-removing treatment effects removal of plating liquid remaining on half of the substrate-contacting portion 360, or the portions in its vicinity, of the sealing member 244. After completion of this treatment, the nozzle head 302 is withdrawn from the housing 70 in the opposite manner to that described above, and the housing 70 is rotated horizontally by 180°. Thereafter, the nozzle head 302 is inserted into the housing 70 through an opening 96' facing the opening 96, and is then moved near to and faces the substrate contacting portion 360, or the portions in its vicinity, of the sealing member 244 in the same manner as described above. The same suction-removing treatment is then carried out to effect removal of plating liquid remaining on the other half of the substrate-contacting portion 360, or portions in its vicinity, of the sealing member 244.

The above plating liquid-removing treatment can suck and remove plating liquid remaining on the substrate-contacting portion 360, or the portions in its vicinity, of the sealing member 244 efficiently in a short time, thus preventing an unremoved plating liquid becoming a source of particle generation. Further, clogging of the plating liquid suction nozzles 302c caused by residue of sucked plating liquid can be prevented.

It is also possible to easily remove plating liquid remaining on the substrate-contacting portion 360, or the portions in its vicinity, of the sealing member 244 merely by a sucking treatment using the plating liquid suction nozzles 302c, without employing a cleaning treatment using the cleaning liquid injection nozzles 302d, when the sucking treatment is conducted at short intervals, such as a case where a sucking treatment is conducted for every plating treatment.

As described hereinabove, according to the present invention, plating liquid remaining on a substrate-contacting portion, or portions in its vicinity, at an inner circumferential edge of a substrate holding member can be fully sucked and removed, forcibly. This can avoid a problem of particle generation which would be caused by unremoved plating liquid after it has dried. Further, the plating apparatus of the present invention, which allows the substrate holding member to rotate, ensures a good embedding of plated film in forming copper interconnects, e.g. by the damascene method, and performs an improved plating, and in addition, can easily and promptly remove plating liquid remaining on the substrate-contacting portion, or the portions in its vicinity, of the substrate holding member. The plating apparatus eliminates the need to rotate a plating liquid-removing device, thus enabling a simplified apparatus structure that requires a smaller space for installation.

Although certain preferred embodiments of the present invention have been shown and described in detail, it should be understood that various changes and modifications may be made therein without departing from the scope of the appended claims.

What is claimed is:

1. A method for removing plating liquid from a substrate-contacting portion, or its vicinity, of a sealing member at an inner circumferential edge of a substrate holding member, said method comprising:

while supporting a substrate on said sealing member, within a housing having said substrate holding member, rotating said substrate holding member, and thereby rotating said sealing member, to remove plating liquid from said substrate and said sealing member;

removing said substrate from said housing; then moving a nozzle head toward said housing such that said nozzle head is positioned close to said substrate-contacting portion of said sealing member, said nozzle head having a plating liquid suction nozzle and a cleaning liquid injection nozzle;

while rotating said substrate holding member, and thereby rotating said sealing member, sucking plating liquid remaining on said substrate-contacting portion, or its vicinity, of said sealing member via said plating liquid suction nozzle; and while sucking plating liquid remaining on said substrate-contacting portion, or its vicinity, of said sealing member,
  (i) ejecting cleaning liquid toward said substrate-contacting portion, or its vicinity, of said sealing member via said cleaning liquid ejection nozzle, and
  (ii) sucking the cleaning liquid from said substrate-contacting portion, or its vicinity, of said sealing member via said plating liquid suction nozzle.

2. The method according to claim 1, wherein sucking plating liquid remaining on said substrate-contacting portion, or its vicinity, of said sealing member while rotating said substrate holding member comprises sucking the plating liquid while rotating said substrate holding member at a first rotational speed, and rotating said substrate holding member to remove plating liquid from said substrate and said sealing member comprises rotating said substrate holding member at a second rotational speed, with said first rotational speed being less than said second rotational speed.

3. The method according to claim 2, wherein rotating said substrate holding member at said second rotational speed results in the plating liquid being removed from said substrate and said sealing member via centrifugal force.

4. The method according to claim 3, wherein said nozzle head extends circumferentially for less than said sealing member extends circumferentially.

5. The method according to claim 4, wherein said first rotational speed is not more than about ten revolutions per minute.

6. The method according to claim 5, wherein sucking plating liquid remaining on said substrate-contacting portion, or its vicinity, of said sealing member while rotating said substrate holding member comprises sucking the plating liquid while rotating said substrate holding member in one direction and then in an opposite direction.

7. The method according to claim 1, wherein sucking plating liquid remaining on said substrate-contacting portion, or its vicinity, of said sealing member while rotating said substrate holding member comprises sucking the plating liquid while rotating said substrate holding member in one direction and then in an opposite direction.

8. A plating method comprising:

while supporting a substrate on a sealing member at an inner circumferential edge of a substrate holding member, within a housing having said substrate holding member,
  (i) applying a plating liquid to said substrate so as to plate said substrate, and
  (ii) rotating said substrate holding member, and thereby rotating said sealing member, to remove plating liquid from said substrate and said sealing member;

removing said substrate from said housing; then moving a nozzle head toward said housing such that said nozzle head is positioned close to said substrate-contacting portion of said sealing member, said nozzle head having a plating liquid suction nozzle and a cleaning liquid injection nozzle;

while rotating said substrate holding member, and thereby rotating said sealing member, sucking plating liquid remaining on said substrate-contacting portion, or its vicinity, of said sealing member via said plating liquid suction nozzle; and while sucking plating liquid remaining on said substrate-contacting portion, or its vicinity, of said sealing member,
  (i) ejecting cleaning liquid toward said substrate-contacting portion, or its vicinity, of said sealing member via said cleaning liquid ejection nozzle, and
  (ii) sucking the cleaning liquid from said substrate-contacting portion, or its vicinity, of said sealing member via said plating liquid suction nozzle.

9. The method according to claim 8, wherein sucking plating liquid remaining on said substrate-contacting portion, or its vicinity, of said sealing member while rotating said substrate holding member comprises sucking the plating liquid while rotating said substrate holding member at a first rotational speed, and rotating said substrate holding member to remove plating liquid from said substrate and said sealing member comprises rotating said substrate holding member at a second rotational speed, with said first rotational speed being less than said second rotational speed.

10. The method according to claim 9, wherein rotating said substrate holding member at said second rotational speed results in the plating liquid being removed from said substrate and said sealing member via centrifugal force.

11. The method according to claim 10, wherein said nozzle head extends circumferentially for less than said sealing member extends circumferentially.

12. The method according to claim 11, wherein said first rotational speed is not more than about ten revolutions per minute.

13. The method according to claim 12, wherein sucking plating liquid remaining on said substrate-contacting portion, or its vicinity, of said sealing member while rotating said substrate holding member comprises sucking the plating liquid while rotating said substrate holding member in one direction and then in an opposite direction.

14. The method according to claim 8, wherein sucking plating liquid remaining on said substrate-contacting portion, or its vicinity, of said sealing member while rotating said substrate holding member comprises sucking the plating liquid while rotating said substrate holding member in one direction and then in an opposite direction.

15. A method for removing plating liquid from a substrate-contacting portion, or its vicinity, of a sealing member at an inner circumferential edge of a substrate holding member, said method comprising:

while supporting a substrate on said sealing member, within a housing having said substrate holding member, rotating said substrate holding member, and thereby rotating said sealing member, to remove plating liquid from said substrate and said sealing member;

removing said substrate from said housing; then moving a nozzle head toward said housing such that said nozzle head is positioned close to said substrate-contacting portion of said sealing member, said nozzle head having a plating liquid suction nozzle;

while rotating said substrate holding member, and thereby rotating said sealing member, sucking plating liquid remaining on said substrate-contacting portion, or its vicinity, of said sealing member via said plating liquid suction nozzle.

16. The method according to claim 15, wherein sucking plating liquid remaining on said substrate-contacting portion, or its vicinity, of said sealing member while rotating said substrate holding member comprises sucking the plating liquid while rotating said substrate holding member at a first rotational speed, and rotating said substrate holding member to remove plating liquid from said substrate and said sealing member comprises rotating said substrate holding member at a second rotational speed, with said first rotational speed being less than said second rotational speed.

17. The method according to claim 16, wherein rotating said substrate holding member at said second rotational speed results in the plating liquid being removed from said substrate and said sealing member via centrifugal force.

18. The method according to claim 17, wherein said nozzle head extends circumferentially for less than said sealing member extends circumferentially.

19. The method according to claim 18, wherein said first rotational speed is not more than about ten revolutions per minute.

20. The method according to claim 19, wherein sucking plating liquid remaining on said substrate-contacting portion, or its vicinity, of said sealing member while rotating said substrate holding member comprises sucking the plating liquid while rotating said substrate holding member in one direction and then in an opposite direction.

21. The method according to claim 15, wherein sucking plating liquid remaining on said substrate-contacting portion, or its vicinity, of said sealing member while rotating said substrate holding member comprises sucking the plating liquid while rotating said substrate holding member in one direction and then in an opposite direction.

* * * * *